(12) United States Patent
Nagami et al.

(10) Patent No.: US 9,875,881 B2
(45) Date of Patent: Jan. 23, 2018

(54) PLASMA PROCESSING APPARATUS AND PLASMA PROCESSING METHOD

(71) Applicant: TOKYO ELECTRON LIMITED, Tokyo (JP)

(72) Inventors: Kohichi Nagami, Miyagi (JP); Norikazu Yamada, Miyagi (JP); Tadashi Gondai, Miyagi (JP); Kouichi Yoshida, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 616 days.

(21) Appl. No.: 14/183,723

(22) Filed: Feb. 19, 2014

(65) Prior Publication Data

US 2014/0231389 A1   Aug. 21, 2014

Related U.S. Application Data

(60) Provisional application No. 61/771,211, filed on Mar. 1, 2013.

(30) Foreign Application Priority Data

Feb. 20, 2013 (JP) ................. 2013-030932
Aug. 28, 2013 (JP) ................. 2013-176416

(51) Int. Cl.
*H01L 21/00* (2006.01)
*C23C 16/00* (2006.01)
*H01J 37/32* (2006.01)

(52) U.S. Cl.
CPC .. *H01J 37/32091* (2013.01); *H01J 37/32174* (2013.01); *H01J 37/32183* (2013.01); *H01J 37/32706* (2013.01); *H01J 37/32944* (2013.01)

(58) Field of Classification Search
CPC ................................. H01J 37/32944
See application file for complete search history.

(56) References Cited

U.S. PATENT DOCUMENTS 5,573,597 A * 11/1996 Lantsman ......... H01J 37/32431
                                                118/723 E
5,699,223 A * 12/1997 Mashiro .............. H01L 21/6831
                                                361/234
(Continued)

FOREIGN PATENT DOCUMENTS

JP       08181118 A   *   7/1996
JP       08260168 A   *  10/1996
(Continued)

*Primary Examiner* — Parviz Hassanzadeh
*Assistant Examiner* — Anna Crowell
(74) *Attorney, Agent, or Firm* — Pearne & Gordon LLP

(57) ABSTRACT

At a first timing after mounting a semiconductor wafer W on an electrostatic chuck 38, a susceptor 12 is switched from an electrically grounded state into a floated state. From a second timing after the first timing, a second high frequency power HF for plasma generation is applied to the susceptor 12, and a processing gas is excited into plasma in a chamber 10. From a third timing after the second timing, a first high frequency power LF for ion attraction is applied to the susceptor 12, and a self-bias $(-V_{dc})$ is generated. From a fourth timing close to the third timing, a negative second DC voltage $-B_{DC}$ corresponding to the self-bias $(-V_{dc})$ is applied to the susceptor 12. From the fifth timing after the fourth timing, a positive first DC voltage $A_{DC}$ is applied to an inner electrode 42 of the electrostatic chuck 38.

15 Claims, 15 Drawing Sheets

(56) References Cited

U.S. PATENT DOCUMENTS

| | | | | |
|---|---|---|---|---|
| 5,708,250 | A | * | 1/1998 | Benjamin ............ H01L 21/6831 156/345.28 |
| 5,863,339 | A | * | 1/1999 | Usami ................... C23C 16/402 118/723 E |
| 8,056,503 | B2 | * | 11/2011 | Kikuchi ............ H01J 37/32174 118/723 E |
| 2005/0115676 | A1 | * | 6/2005 | Gondai ............ H01J 37/32706 156/345.47 |
| 2006/0171093 | A1 | * | 8/2006 | Ishimura ............... H01J 37/321 361/234 |
| 2008/0026488 | A1 | | 1/2008 | Panda |
| 2008/0068774 | A1 | * | 3/2008 | Sumiya ............. H01J 37/32091 361/235 |
| 2009/0026170 | A1 | * | 1/2009 | Tanaka ............. H01J 37/32706 216/60 |
| 2010/0136793 | A1 | * | 6/2010 | Chen ................. H01J 37/32082 438/710 |

FOREIGN PATENT DOCUMENTS

| | | | |
|---|---|---|---|
| JP | 11111826 A | * | 4/1999 |
| JP | 2011-210958 A | | 10/2011 |

* cited by examiner

FIG. 8

| SELF-BIAS $-V_{dc}$ (V) | | LF POWER $P_{LF}$ (W) | | | | | | |
|---|---|---|---|---|---|---|---|---|
| | | 100 | 200 | 500 | 1000 | 2500 | 4800 | 5800 |
| HF POWER $P_{HF}$ (W) | 100 | $-a_{1,1}$ | $-a_{1,2}$ | $-a_{1,3}$ | $-a_{1,4}$ | $-a_{1,5}$ | $-a_{1,6}$ | $-a_{1,7}$ |
| | 300 | $-a_{2,1}$ | $-a_{2,2}$ | $-a_{2,3}$ | $-a_{2,4}$ | $-a_{2,5}$ | $-a_{2,6}$ | $-a_{2,7}$ |
| | 500 | $-a_{3,1}$ | $-a_{3,2}$ | $-a_{3,3}$ | $-a_{3,4}$ | $-a_{3,5}$ | $-a_{3,6}$ | $-a_{3,7}$ |
| | 1000 | $-a_{4,1}$ | $-a_{4,2}$ | $-a_{4,3}$ | $-a_{4,4}$ | $-a_{4,5}$ | $-a_{4,6}$ | $-a_{4,7}$ |
| | 1700 | $-a_{5,1}$ | $-a_{5,2}$ | $-a_{5,3}$ | $-a_{5,4}$ | $-a_{5,5}$ | $-a_{5,6}$ | $-a_{5,7}$ |
| | 2400 | $-a_{6,1}$ | $-a_{6,2}$ | $-a_{6,3}$ | $-a_{6,4}$ | $-a_{6,5}$ | $-a_{6,6}$ | $-a_{6,7}$ |

FIG. 9A $-B_{DC} = -b_1$ (V)

| POTENTIAL DIFFERENCE $\Delta V$ (V) | | LF POWER $P_{LF}$ (W) | | | | | | |
|---|---|---|---|---|---|---|---|---|
| | | 100 | 200 | 500 | 1000 | 2500 | 4800 | 5800 |
| HF POWER $P_{HF}$ (W) | 100 | $a_{1,1}-b_1$ | $a_{1,2}-b_1$ | $a_{1,3}-b_1$ | $a_{1,4}-b_1$ | $a_{1,5}-b_1$ | $a_{1,6}-b_1$ | $a_{1,7}-b_1$ |
| | 300 | $a_{2,1}-b_1$ | $a_{2,2}-b_1$ | $a_{2,3}-b_1$ | $a_{2,4}-b_1$ | $a_{2,5}-b_1$ | $a_{2,6}-b_1$ | $a_{2,7}-b_1$ |
| | 500 | $a_{3,1}-b_1$ | $a_{3,2}-b_1$ | $a_{3,3}-b_1$ | $a_{3,4}-b_1$ | $a_{3,5}-b_1$ | $a_{3,6}-b_1$ | $a_{3,7}-b_1$ |
| | 1000 | $a_{4,1}-b_1$ | $a_{4,2}-b_1$ | $a_{4,3}-b_1$ | $a_{4,4}-b_1$ | $a_{4,5}-b_1$ | $a_{4,6}-b_1$ | $a_{4,7}-b_1$ |
| | 1700 | $a_{5,1}-b_1$ | $a_{5,2}-b_1$ | $a_{5,3}-b_1$ | $a_{5,4}-b_1$ | $a_{5,5}-b_1$ | $a_{5,6}-b_1$ | $a_{5,7}-b_1$ |
| | 2400 | $a_{6,1}-b_1$ | $a_{6,2}-b_1$ | $a_{6,3}-b_1$ | $a_{6,4}-b_1$ | $a_{6,5}-b_1$ | $a_{6,6}-b_1$ | $a_{6,7}-b_1$ |

FIG. 9B $-B_{DC} = -b_2$ (V)

| POTENTIAL DIFFERENCE ΔV (V) | LF POWER P$_{LF}$ (W) | | | | | | |
|---|---|---|---|---|---|---|---|
| | 100 | 200 | 500 | 1000 | 2500 | 4800 | 5800 |
| HF POWER P$_{HF}$ (W) 100 | a$_{1,1}$-b$_2$ | a$_{1,2}$-b$_2$ | a$_{1,3}$-b$_2$ | a$_{1,4}$-b$_2$ | a$_{1,5}$-b$_2$ | a$_{1,6}$-b$_2$ | a$_{1,7}$-b$_2$ |
| 300 | a$_{2,1}$-b$_2$ | a$_{2,2}$-b$_2$ | a$_{2,3}$-b$_2$ | a$_{2,4}$-b$_2$ | a$_{2,5}$-b$_2$ | a$_{2,6}$-b$_2$ | a$_{2,7}$-b$_2$ |
| 500 | a$_{3,1}$-b$_2$ | a$_{3,2}$-b$_2$ | a$_{3,3}$-b$_2$ | a$_{3,4}$-b$_2$ | a$_{3,5}$-b$_2$ | a$_{3,6}$-b$_2$ | a$_{3,7}$-b$_2$ |
| 1000 | # a$_{4,1}$-b$_2$ | a$_{4,2}$-b$_2$ | a$_{4,3}$-b$_2$ | a$_{4,4}$-b$_2$ | a$_{4,5}$-b$_2$ | a$_{4,6}$-b$_2$ | a$_{4,7}$-b$_2$ |
| 1700 | # a$_{5,1}$-b$_2$ | a$_{5,2}$-b$_2$ | a$_{5,3}$-b$_2$ | a$_{5,4}$-b$_2$ | a$_{5,5}$-b$_2$ | a$_{5,6}$-b$_2$ | a$_{5,7}$-b$_2$ |
| 2400 | # a$_{6,1}$-b$_2$ | a$_{6,2}$-b$_2$ | a$_{6,3}$-b$_2$ | a$_{6,4}$-b$_2$ | a$_{6,5}$-b$_2$ | a$_{6,6}$-b$_2$ | a$_{6,7}$-b$_2$ |

FIG. 9C $-B_{DC} = -b_3$ (V)

| POTENTIAL DIFFERENCE ΔV (V) | LF POWER P$_{LF}$ (W) | | | | | | |
|---|---|---|---|---|---|---|---|
| | 100 | 200 | 500 | 1000 | 2500 | 4800 | 5800 |
| HF POWER P$_{HF}$ (W) 100 | # a$_{1,1}$-b$_3$ | # a$_{1,2}$-b$_3$ | a$_{1,3}$-b$_3$ | a$_{1,4}$-b$_3$ | a$_{1,5}$-b$_3$ | a$_{1,6}$-b$_3$ | a$_{1,7}$-b$_3$ |
| 300 | # a$_{2,1}$-b$_3$ | # a$_{2,2}$-b$_3$ | a$_{2,3}$-b$_3$ | a$_{2,4}$-b$_3$ | a$_{2,5}$-b$_3$ | a$_{2,6}$-b$_3$ | a$_{2,7}$-b$_3$ |
| 500 | # a$_{3,1}$-b$_3$ | # a$_{3,2}$-b$_3$ | a$_{3,3}$-b$_3$ | a$_{3,4}$-b$_3$ | a$_{3,5}$-b$_3$ | a$_{3,6}$-b$_3$ | a$_{3,7}$-b$_3$ |
| 1000 | # a$_{4,1}$-b$_3$ | # a$_{4,2}$-b$_3$ | a$_{4,3}$-b$_3$ | a$_{4,4}$-b$_3$ | a$_{4,5}$-b$_3$ | a$_{4,6}$-b$_3$ | a$_{4,7}$-b$_3$ |
| 1700 | # a$_{5,1}$-b$_3$ | # a$_{5,2}$-b$_3$ | # a$_{5,3}$-b$_3$ | a$_{5,4}$-b$_3$ | a$_{5,5}$-b$_3$ | a$_{5,6}$-b$_3$ | a$_{5,7}$-b$_3$ |
| 2400 | # a$_{6,1}$-b$_3$ | # a$_{6,2}$-b$_3$ | # a$_{6,3}$-b$_3$ | # a$_{6,4}$-b$_3$ | a$_{6,5}$-b$_3$ | a$_{6,6}$-b$_3$ | a$_{6,7}$-b$_3$ |

MAPPING TABLE

| | | VARIABLE CAPACITOR POSITION $PC_1$ | | | | | |
|---|---|---|---|---|---|---|---|
| | | $P_1C_1$ | $P_2C_1$ | ........ | $P_iC_1$ | ........ | $P_mC_1$ |
| VARIABLE CAPACITOR POSITION $PC_2$ | $P_1C_2$ | $R_{11},X_{11}$ | $R_{21},X_{21}$ | ........ | $R_{i1},X_{i1}$ | ........ | $R_{m1},X_{m1}$ |
| | $P_2C_2$ | $R_{12},X_{12}$ | $R_{22},X_{22}$ | ........ | $R_{i2},X_{i2}$ | ........ | $R_{m2},X_{m2}$ |
| | . | . | . | ........ | . | ........ | . |
| | $P_jC_2$ | $R_{1j},X_{1j}$ | $R_{2j},X_{2j}$ | ........ | $R_{ij},X_{ij}$ | ........ | $R_{mj},X_{mj}$ |
| | . | . | . | ........ | . | ........ | . |
| | $P_nC_2$ | $R_{1n},X_{1n}$ | $R_{2n},X_{2n}$ | ........ | $R_{in},X_{in}$ | ........ | $R_{mn},X_{mn}$ |

SMITH CHART

PLASMA PROCESSING APPARATUS AND PLASMA PROCESSING METHOD

CROSS-REFERENCE TO RELATED APPLICATION

This application claims the benefit of Japanese Patent Application Nos. 2013-030932 and 2013-176416 filed on Feb. 20, 2013 and Aug. 28, 2013, respectively, and U.S. Provisional Application Ser. No. 61/771,211 filed on Mar. 1, 2013, the entire disclosures of which are incorporated herein by reference.

TECHNICAL FIELD

The embodiments described herein pertain generally to a technique for performing a plasma process on a target substrate, and particularly, to a single-substrate plasma processing apparatus and a plasma processing method using an electrostatic chuck configured to hold a substrate on a high frequency electrode in a processing chamber.

BACKGROUND

Typically, in a single-substrate plasma processing apparatus, a target substrate made of a single substance (for example, semiconductor wafer) is mounted on a sample table called susceptor or the like within an evacuable processing chamber, and a plasma process such as dry etching, oxidation, deposition, or the like is performed thereon.

In general, the susceptor serving as a high frequency electrode is made of a conductor, for example, aluminum, having high conductivity and processability, and is provided without being grounded, i.e. in a state of being electrically floated, within the processing chamber. Further, a high frequency power having a certain frequency is applied to the susceptor from a high frequency power supply at an outside of the processing chamber via a matching device during the plasma process.

Further, mechanistically, lift pins configured to load an unprocessed substrate to the susceptor and unload a processed substrate from the susceptor is passed through the susceptor to be moved up and down.

Furthermore, in order to control a temperature of the substrate during the plasma process, a cooling medium path for cooling or a heater for heating is provided within or around the susceptor. In this case, in order to efficiently transfer a heat of the susceptor to the substrate, a back side gas (typically, He gas) for heat transfer is supplied at a preset pressure to a rear surface of the substrate through a gas path formed in the susceptor.

In the plasma processing apparatus using the susceptor as described above, an electrostatic chuck is provided as one body at a main surface of the susceptor, i.e. a substrate mounting surface, in order to hold the substrate on the susceptor. In such an electrostatic chuck, a thin conductive layer or an inner electrode is provided within a dielectric film. Further, a static electricity is generated on the substrate mounted on the susceptor by applying a high DC voltage (typically, about 2000 V to about 3000 V) to the inner electrode, so that the substrate is attracted or held by an electrostatic force.

However, in the plasma processing apparatus including the susceptor serving as a high frequency electrode as described above, when a positive and high DC voltage is applied to the inner electrode within the electrostatic chuck, a gas is electrically discharged between the substrate and the susceptor, so that the substrate is likely to be damaged. That is, in the electrostatic chuck, there are formed through holes through which the lift pins or the back side gas passes, and these through holes form a gas space between the substrate and the susceptor. When a positive and high DC voltage is applied to the inner electrode of the electrostatic chuck, a potential of the susceptor is increased to, for example, about 1000 V or more by electrostatic induction. Meanwhile, since a high frequency power is applied to the substrate and the substrate is exposed to plasma, a potential on a surface of the substrate is decreased to a negative potential (for example, about −500 V or less) equal to a self-bias. As a result, there is made a great potential difference between the substrate and the susceptor, so that abnormal electric discharge sufficient to damage the substrate is likely to be generated within the gas space between the both parts.

Conventionally, in order to suppress such abnormal electric discharge between a substrate and a susceptor, there is provided a plasma processing apparatus in which a focus ring provided at a peripheral region surrounding a wafer mounting region on the susceptor via a dielectric layer is electrically connected to the susceptor by a current limiting device such as a resistant pin (Patent Document 1). In this plasma processing apparatus, even if a high frequency power is applied to the susceptor, to expose the susceptor to plasma and a positive and high DC voltage is applied to an inner electrode of an electrostatic chuck, electric charges move between the susceptor and the focus ring via the current limiting device, so that a potential of the susceptor becomes closer to a potential of a substrate as well as a potential of the focus ring. As a result, it is difficult to generate electric discharge within the gas space between the substrate and the susceptor.

Patent Document 1: Japanese Patent Laid-open Publication No. 2011-210958

In the plasma processing apparatus in which the susceptor and the focus ring are electrically connected by the current limiting device, the focus ring is a replacement part which is consumed. Therefore, practically, the current limiting device cannot be bonded to the focus ring by welding or soldering and just can be electrically connected by pressurizing a spring or the like. However, according to this contact type, it is difficult to obtain a good electric conductivity between the focus ring and the current limiting device, and a great potential difference at an interface thereof may be easily made. For this reason, it is difficult for the current limiting device to exhibit its own function.

SUMMARY

In view of the foregoing problems, example embodiments provide a plasma processing apparatus and a plasma processing method capable of stably and securely suppressing abnormal electric discharge between a target substrate and a high frequency electrode (susceptor) configured to mount thereon the target substrate via an electrostatic chuck even if a current limiting device is not provided between the susceptor and a focus ring.

In one example embodiment, a plasma processing apparatus includes a processing chamber in which a plasma process is performed; a susceptor made of a conductor and configured to mount thereon a target substrate within the processing chamber; a first high frequency power supply unit configured to apply a first high frequency power to the susceptor; an electrostatic chuck that is provided on a main surface of the susceptor to hold the substrate on the susceptor by an electrostatic force; and a DC voltage applying unit configured to apply, to the susceptor, a negative DC voltage corresponding to a self-bias generated between plasma and the substrate.

In the plasma processing apparatus configured as described above, a potential on a surface of the substrate exposed to plasma during a plasma process becomes a negative potential equal to the self-bias, and a negative DC voltage corresponding to the self-bias is applied to the susceptor by a DC voltage applying unit. Therefore, a small potential difference between the substrate and the susceptor is maintained, and abnormal electric discharge is not generated in the periphery of the substrate (particularly, in a gas space between the substrate and the susceptor).

In another example embodiment, a plasma processing method includes mounting a target substrate on an electrostatic chuck provided on a main surface of a conductive susceptor within a processing chamber; switching a state of the susceptor from an electrically grounded state into a floated state at a first time point after the target substrate is mounted on the electrostatic chuck; generating plasma by exciting a processing gas within the processing chamber from a second time point after the first time point; applying, to the susceptor, a first high frequency power having a frequency suitable for attracting ions of the plasma to the target substrate from a third time point after the second time point; applying, to the susceptor, a negative DC voltage corresponding to a self-bias generated between the plasma and the target substrate from a fourth time point close to the third time point after the second time point; and applying a positive DC voltage to an inner electrode of the electrostatic chuck from a fifth time point after the fourth time point to hold the target substrate on the susceptor.

In the plasma processing method described above, since a negative DC voltage corresponding to the self-bias is applied to the susceptor, in a normal state, abnormal electric discharge is not generated in the periphery of the substrate (particularly, in a gas space between the substrate and the susceptor). Further, right after a plasma process is started, a potential of the susceptor is decreased at the substantially same time when a potential of the substrate is decreased to the self-bias. Therefore, even when a positive DC voltage is applied to the inner electrode of the electrostatic chuck, and even if a plasma load is changed at the time of starting the process, abnormal electric discharge is not generated in the periphery of the substrate (particularly, in the gas space between the substrate and the susceptor).

According to the plasma processing apparatus and the plasma processing method in accordance with the example embodiments, due to the above-described configuration and operation, it is possible to stably and securely suppress abnormal electric discharge between a target substrate and a high frequency electrode (susceptor) configured to mount the target substrate thereon via an electrostatic chuck even if a current limiting device is not provided between the susceptor and a focus ring.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent from the following detailed description. The use of the same reference numbers in different figures indicates similar or identical items.

FIG. 8 illustrates an example table of database obtained by a first simulation in the second experimental example;

FIG. 9A illustrates an example table of database obtained by a second simulation in the second experimental example;

FIG. 9B illustrates an example table of database obtained by the second simulation in the second experimental example;

FIG. 9C illustrates an example table of database obtained by the second simulation in the second experimental example;

DETAILED DESCRIPTION

Figure 1:
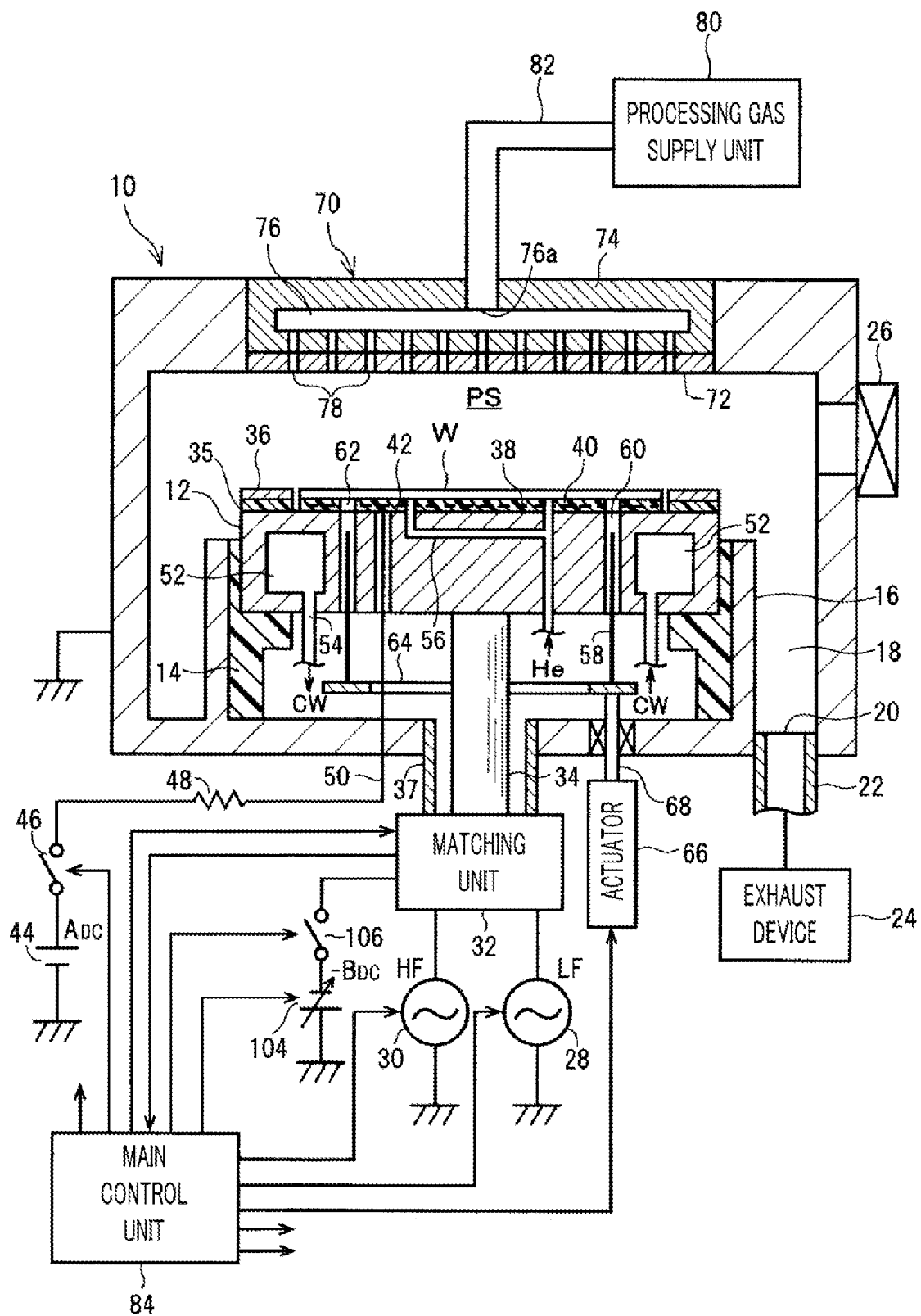
FIG. 1 is a cross sectional view of a plasma processing apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example. Still, the examples described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

(Overall Configuration of Plasma Processing Apparatus)

FIG. 1 illustrates a schematic configuration of a plasma processing apparatus in accordance with an example embodiment. This plasma processing apparatus is configured as a capacitively coupled plasma etching apparatus of a lower electrode dual frequency application type, and includes a cylindrical chamber (processing chamber) 10 made of metal such as aluminum or stainless steel. The chamber 10 is grounded.

In the chamber 10, a circular plate-shaped susceptor 12 configured to mount thereon a target substrate, for example, a semiconductor wafer W, is horizontally provided as a lower electrode. The susceptor 12 is made of a conductor, for example, aluminum, having high conductivity and processability, and is supported by a cylindrical insulating supporting member 14 that is extended vertically and upwardly from a bottom of the chamber 10 and is made of, for example, ceramic without being grounded. Along an outer periphery of the cylindrical insulating supporting member 14, an annular exhaust path 18 is formed between an inner wall of the chamber 10 and a cylindrical conductive supporting member 16 that is extended vertically and upwardly from the bottom of the chamber 10. Further, an exhaust opening 20 is formed at a bottom of the exhaust path 18. The exhaust opening 20 is connected to an exhaust device 24 via an exhaust pipe 22. The exhaust device 24 includes a vacuum pump such as a turbo-molecular pump and is configured to depressurize a processing space in the chamber 10 to a desired vacuum level. At a side wall of the chamber 10, there is provided a gate valve 26 configured to open and close a loading/unloading opening for the semiconductor wafer W.

The susceptor 12 is electrically connected to first and second high frequency power supplies 28 and 30 via a matching unit 32 and a power supply rod 34. Herein, the first high frequency power supply 28 is configured to mainly output a first frequency power LF having a preset frequency (for example, about 13.56 MHz) for ion attraction to the semiconductor wafer W on the susceptor 12. Meanwhile, the second high frequency power supply 30 is configured to mainly output a second high frequency power HF having a preset frequency (for example, about 100 MHz) for plasma generation. The matching unit 32 accommodates first and second matching devices 100 and 102 (FIG. 2) for impedance matching between the first and second high frequency power supplies 28 and 30 and a load (mainly, plasma).

The power supply rod 34 is formed of a cylindrical conductor having a preset outer diameter. An upper end thereof is connected to a central portion of a bottom surface of the susceptor 12, and a lower end thereof is connected to high frequency power output terminals of the first and second matching devices 100 and 102 in the matching unit 32. Further, between a bottom surface of the chamber 10 and the matching unit 32, a cylindrical conductor cover 37 surrounding the power supply rod 34 is provided.

The susceptor 12 has a diameter bigger than the semiconductor wafer W. A top surface, i.e. a main surface, of the susceptor 12 is divided into a central region, i.e. a wafer mounting region, having the substantially same shape (circular shape) and the substantially same size as the semiconductor wafer W, and an annular peripheral region extending from the wafer mounting region. On the wafer mounting region, the semiconductor wafer W as a target object is mounted via an electrostatic chuck 38 to be described later. On the annular peripheral region, a ring-shaped plate, so-called focus ring 36, having an inner diameter larger than a diameter of the semiconductor wafer W is provided via a ring-shaped dielectric layer 35. This focus ring 36 is made of any one material of, for example, Si, SiC, C, and $SiO_2$ depending on a material of an etching target mounted on a surface of the semiconductor wafer W.

On the wafer mounting region of the susceptor 12, the electrostatic chuck 38 configured to hold and attract a wafer is provided. In the electrostatic chuck 38, an inner electrode 42 is provided within a dielectric layer 40 formed or fixed as one body on an upper surface of the susceptor 12. The inner electrode 42 is electrically connected to a first DC power supply 44 provided at an outside of the chamber 10 via a switch 46, a resistor 48 having a high resistance value, and a DC high tension line 50. When a positive first high DC voltage $A_{DC}$ (for example, about 2000 V to about 3000 V) is applied from the first DC power supply 44 to the inner electrode 42 of the electrostatic chuck 38, the semiconductor wafer W is attracted to and held onto the electrostatic chuck 38 by an electrostatic force. Further, the DC high tension line 50 is a coated line, and passes through the susceptor 12 from below and is connected to the inner electrode 42 of the electrostatic chuck 38.

Within the susceptor 12, for example, an annular cooling room or a coolant path 52 extending along a circumference thereof is provided. In the coolant path 52, a coolant, for example, cooling water CW having a certain temperature is circulated and supplied from a chiller unit (not illustrated) via a coolant supply line 54. According to a temperature of the coolant, a temperature of the susceptor 12 can be controlled to be decreased. Further, in order to thermally connect the semiconductor wafer W to the susceptor 12, a back side gas, for example, a He gas, for heat transfer is supplied from a back side gas supply unit (not illustrated) to a contact interface between the electrostatic chuck 38 and the semiconductor wafer W through a gas supply line and a gas path 56 within the susceptor 12.

In the susceptor 12 and the electrostatic chuck 38, there are provided through holes 60 and 62 through which multiple (for example, three) lift pins 58 configured to load/unload the semiconductor wafer W on the susceptor 12 are passed to be moved up and down. The lift pins 58 are made of an insulating material such as a resin or ceramic, and supported on a ring-shaped horizontal elevating plate 64. The horizontal elevating plate 64 is connected to an elevation driving shaft 68 of an actuator 66 formed of an air cylinder or a ball screw device.

At a ceiling of the chamber 10, a shower head 70 serving as an upper electrode is provided to face the susceptor 12 in parallel with each other. The shower head 70 includes an electrode plate 72 facing the susceptor 12, and an electrode supporting body 74 configured to support the electrode plate 72 from above to be detachably attached thereto. A gas room 76 is formed within the electrode supporting body 74, and multiple gas discharge holes 78 from the gas room 76 toward the susceptor 12 are formed in the electrode supporting body 74 and the electrode plate 72. A space PS between the electrode plate 72 and the susceptor 12 becomes a plasma generation space and a processing space. A gas inlet opening 76a formed at an upper portion of the gas room 76 is connected to a gas supply line 82 from a processing gas supply unit 80. The electrode plate 72 is made of, for example, Si, SiC, or C, and the electrode supporting body 74 is made of, for example, alumite treated aluminum.

This plasma etching apparatus includes a second DC power supply 104 configured to apply a negative and variable second DC voltage $-B_{DC}$ to the susceptor 12. An output terminal of the second DC power supply 104 is electrically connected to a first high frequency power supply unit 108 (FIG. 2) in the matching unit 32 via a switch 106.

A main control unit 84 includes a micro-computer and various interfaces, and is configured to control an operation of each component of the plasma etching apparatus, for example, the exhaust device 24, the high frequency power supplies 28 and 30, the matching unit 32 (matching devices 102 and 104), the switches 46 and 106, the second DC power supply (variable DC power supply) 104, the actuator 66 of a lift device, the chiller unit (not illustrated), the back side gas supply unit (not illustrated), and the processing gas supply unit 80, and the overall operation (sequence) thereof in response to software (program) and recipe information stored in an external memory or an internal memory.

Further, in the present example embodiment, the main control unit 84 is illustrated as a single control unit. However, functions of the main control unit 84 may be divided by multiple control units in a parallel or hierarchical fashion.

A basic operation of single-substrate dry etching in this plasma etching apparatus is performed as follows. First, the gate valve 26 is opened to introduce a transfer arm (not illustrated) from a load lock chamber or a transfer chamber (not illustrated) as an adjacent chamber, so that the semiconductor wafer W as a target object is loaded into the chamber 10. In this loading operation, the actuator 66 is operated and the lift pins 58 are moved up to receive the semiconductor wafer W from the transfer arm, and then, the lift pins 58 are moved down to mount the semiconductor wafer W on a main surface of the susceptor 12, i.e., on the electrostatic chuck 38. Further, an etching gas (typically, a mixed gas) is introduced from the processing gas supply unit 80 into the chamber 10 at a preset flow rate, and a pressure within the chamber 10 is controlled to a preset value by the exhaust device 24. Furthermore, by turning on the first and second high frequency power supplies 28 and 30, the first high frequency power LF and the second high frequency power HF are respectively outputted at preset power levels, and these high frequency powers LF and HF are applied to the susceptor 12 (lower electrode) via the matching unit 32 and the power supply rod 34. Further, turning on the switch 46, the semiconductor wafer W is held on the electrostatic chuck 38 by an electrostatic force and a back side gas (He gas) for heat transfer is supplied to the contact interface between the electrostatic chuck 38 and the semiconductor wafer W from the back side gas supply unit. Plasma is generated by high frequency electric discharge of the etching gas discharged into the processing space PS between the two electrodes 70 and 12 through the shower head 70, and a target film on the surface of the semiconductor wafer W is etched in a desired pattern by radicals or ions supplied from the plasma.

The plasma etching apparatus is of a cathode coupling type, and since the second high frequency power HF having a relatively high frequency (for example, about 100 MHz) suitable for plasma generation is applied to the susceptor 12, plasma can have a high density in a desired dissociation state and plasma having a high density can be formed even under a condition of a lower pressure. At the same time, since the first high frequency power LF having a relatively low frequency (for example, about 13.56 MHz) suitable for ion attraction is applied to the susceptor 12, anisotropic etching advantageous in a vertical etching profile with respect to the semiconductor wafer W on the susceptor 12 can be obtained.

Further, in the plasma etching apparatus, the first high frequency power LF for ion attraction is applied to the susceptor (lower electrode) 12 exposed to plasma. Further, while applying the positive first DC voltage $A_{DC}$ from the first DC power supply 44 to the inner electrode 42 of the electrostatic chuck 38 in order to hold the semiconductor wafer W on the susceptor 12, the negative second DC voltage $-B_{DC}$ corresponding to the self-bias $(-V_{dc})$ is applied from the second DC power supply 104 to the susceptor 12. As a result, a potential difference between the semiconductor wafer W and the susceptor 12 can be suppressed to be as small as possible. For this reason, there is no possibility of generation of abnormal electric discharge in the gas spaces 56, 60, and 62 between the semiconductor wafer W and the susceptor 12. Therefore, the semiconductor wafer W is not damaged by abnormal electric discharge, so that it is possible to improve a plasma etching process yield.

(Configuration in Matching Unit)

Figure 2:
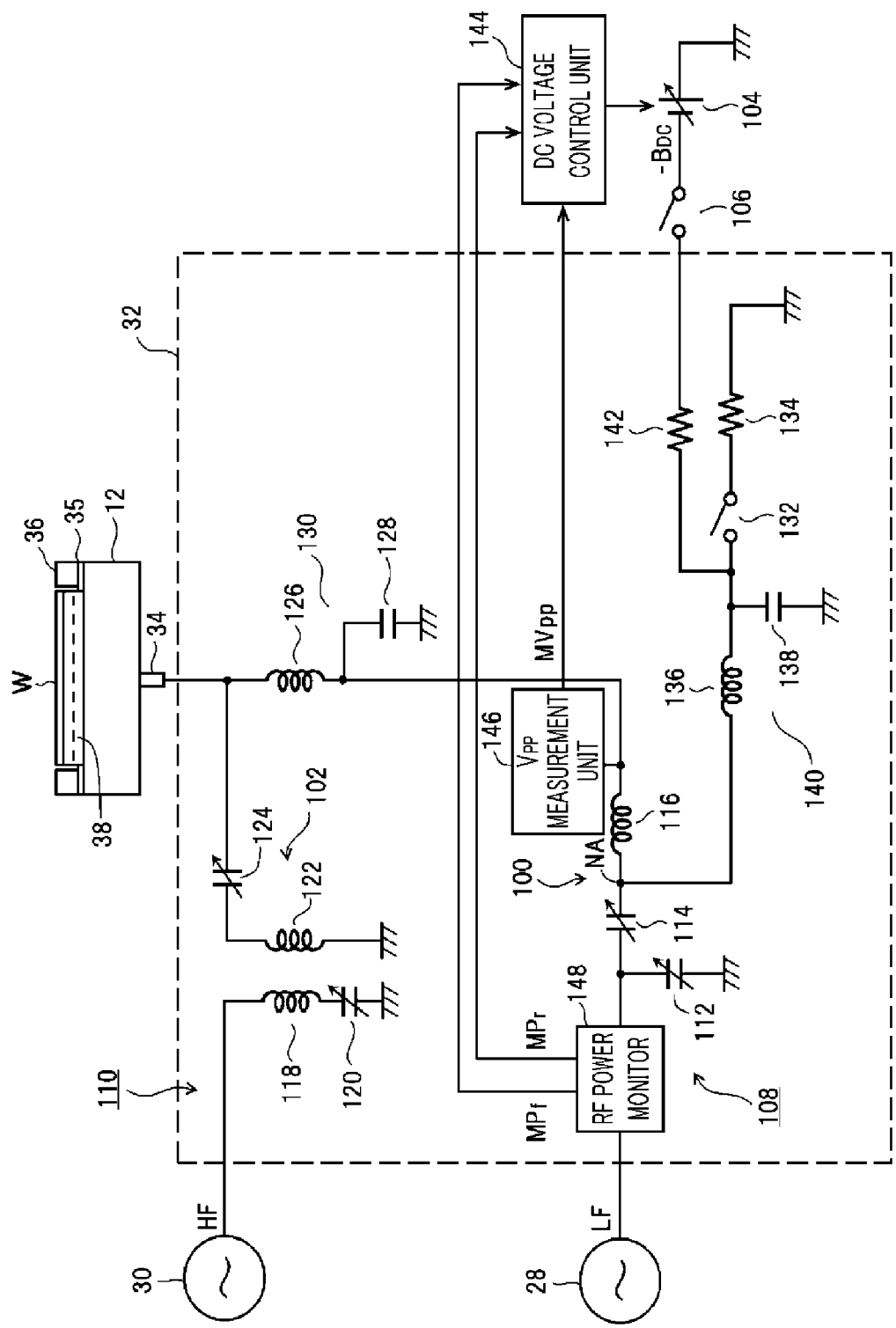
FIG. 2 is a circuit diagram illustrating a circuit configuration in a matching unit of the plasma processing apparatus.

FIG. 2 illustrates a circuit configuration in the matching unit 32 of the plasma etching apparatus.

The matching unit 32 includes the first and second matching devices 100 and 102. The first matching device 100 is configured to efficiently transmit the first high frequency power LF for ion attraction outputted from the first high frequency power supply 28 to a plasma load within the chamber 10 without reflection or with few reflections, and constitutes the first high frequency power supply unit 108 with the first high frequency power supply 28. Meanwhile, the second matching device 102 is configured to efficiently transmit the second high frequency power HF for plasma generation outputted from the second high frequency power supply 30 to the plasma load within the chamber 10 without reflection or with few reflections, and constitutes the second high frequency power supply unit 110 with the second high frequency power supply 30.

The first matching device 100 includes an L-shaped matching circuit including a capacitor 114 and a coil 116 connected in series between an output terminal of the first high frequency power supply 28 and a load, and a capacitor 112 connected between an input terminal of the capacitor 114 and a ground potential member (not illustrated). The capacitors 112 and 114 are variable capacitors. When the first high frequency power supply 28 outputs the first high frequency power LF, a first automatic matching device (not illustrated) including a matching controller and a step motor is configured to variably control an electrostatic capacitance of each of the variable capacitors 112 and 114 such that impedance of a load side including the matching circuit (112, 114, and 116) is equal to impedance (typically, about 50Ω) of the first high frequency power supply 28 side.

The second matching device 102 includes an inductively coupled matching circuit including a primary coil 118 and a primary capacitor 120 connected in series between an output terminal of the second high frequency power supply 30 and a ground potential member (not illustrated), a secondary coil 122 transformer-coupled to the primary coil 118, and a secondary capacitor 124 connected in series between the secondary coil 122 and the load. The capacitors 120 and 124 are variable capacitors. When the second high frequency power supply 30 outputs the second high frequency power HF, a second automatic matching device (not illustrated) including a matching controller and a step motor is configured to variably control an electrostatic capacitance of each of the variable capacitors 120 and 124 such that impedance of the load side including the matching circuit (118 to 124) is equal to impedance (typically, about 50Ω) of the second high frequency power supply 30 side.

The first high frequency power supply unit 108 includes an L-shaped low pass filter 130, including a coil 126 and a capacitor 128, provided between an output terminal of the first matching device 100 and the power supply rod 34. This low pass filter 130 is configured to allow the first high frequency power LF from the first matching device 100 and the second DC voltage $-B_{DC}$ from the second DC power supply 104 to flow toward the susceptor 12, and configured to block the second high frequency power HF from the second high frequency power supply unit 110.

Further, within the second high frequency power supply unit 110, the coils 118 and 122 transformer-coupled in the second matching device 102 are configured to block the first high frequency power LF from the first high frequency power supply unit 108.

Within a housing of the matching unit 32, in addition to the above-described first and second matching devices 100 and 102, a relay switch 132 for frame ground is primarily provided. One terminal of this relay switch 132 is connected to a ground potential member (not illustrated) via a resistor 134 and the other terminal thereof is connected to a high frequency transmission line (connection point NA between the capacitor 114 and the coil 116 in the illustration) within the first matching device 100 via an L-shaped high frequency power blocking filter 140 including a coil 136 and a capacitor 138. The high frequency power blocking filter 140 has a filter characteristic of allowing a direct current to flow through and blocking high frequency powers other than the first high frequency power LF.

When the relay switch 132 is turned off, the connection point NA within the first matching device 100 is electrically floated, so that the susceptor 12 is also floated. When the relay switch 132 is turned on, electric charges accumulated until then in the susceptor 12 flow toward the ground potential member (ground) through the connection point NA, the low pass filter 140, the relay switch 132, and the resistor 134. As a result, a potential of the susceptor 12 is normally maintained at a ground potential.

In this example embodiment, the second DC power supply 104 is connected in parallel with the relay switch 132. To be more specific, the output terminal of the second DC power supply 104 is connected to the connection point NA within the first matching device 100 via a resistor 142 and the high frequency power blocking filter 140. Herein, the resistor 142 constitutes a secondary high frequency power blocking filter configured to securely block high frequency powers other than the first high frequency power LF, which may leak from the primary high frequency power blocking filter 140.

An output voltage (second DC voltage) $-B_{DC}$ of the second DC power supply 104 is applied to the susceptor 12 via the resistor (high frequency power blocking filter) 142, the coil 136 of the high frequency power blocking filter 140, the coil 116 of the first matching device 100, and the coil 126 of the low pass filter 130. Meanwhile, the second DC power supply 104 is masked from the first high frequency power supply unit 108 by the high frequency power blocking filters 140 and 142, and also masked from the second high frequency power supply unit 110 by the low pass filter 130. Therefore, it does not affect the matching operations of the first and second matching devices 100 and 102.

The second DC power supply 104 is configured to variably control the output voltage (second DC voltage) $-B_{DC}$ in a preset range (for example, about −3000 V to about 0 V) under the control of a DC voltage control unit 144 constituting the main control unit 84. The DC voltage control unit 144 can adjust the output voltage $-B_{DC}$ of the second DC power supply 104 to be an appropriate preset value (fixed value) based on recipe information. However, in this example embodiment, the second DC voltage $-B_{DC}$ which can respond to an unsettled or dynamic change of a surface potential (the same negative potential as the self-bias $(-V_{dc})$) of the semiconductor wafer W on the susceptor 12 exposed to plasma during a plasma process is outputted from the second DC power supply 104 under the control of the DC voltage control unit 144.

On the high frequency transmission line of the first high frequency power supply unit 108, a $V_{PP}$ measurement unit 146 configured to measure a voltage amplitude (for example, peak to peak value) $V_{PP}$ of the first high frequency power LF and a RF power monitor 148 (for example, directional coupler) configured to measure a traveling wave power $P_f$ and a reflected wave power $P_r$ of the first high frequency power LF are provided. A $V_{PP}$ measurement value $MV_{pp}$ measured from the $V_{PP}$ measurement unit 146, and a traveling wave power measurement value $MP_f$ and a reflected wave power measurement value $MP_r$ measured from the RF power monitor 148 are outputted to the DC voltage control unit 144.

In general, if the multiple high frequency powers LF and HF having different frequencies are applied to the susceptor 12 as described in this example embodiment, the voltage amplitude $V_{PP}$ of the high frequency power LF having the lowest frequency dominantly controls a voltage amplitude of a high frequency power on the susceptor 12. In particular, if the second high frequency power HF has a high frequency of about 100 MHz or more, the voltage amplitude $V_{PP}$ of the second high frequency power HF on the susceptor 12 is negligibly low. Meanwhile, in normal, between an absolute value ($V_{dc}$) of the self-bias ($-V_{dc}$) and an amplitude $V_{PP}$ of a high frequency voltage on the susceptor 12, there is a preset proportional relation, i.e. $V_{dc} \approx KV_{pp}$ (K is a coefficient: 0<K<1). Therefore, basically or normally, the DC voltage control unit 144 controls the output voltage (second DC voltage) $-B_{DC}$ of the second DC power supply 104 to satisfy, for example, $-B_{DC} = -K*MV_{pp}$, according to the RF voltage amplitude measurement value $MV_{pp}$ measured from the $V_{PP}$ measurement unit 146.

However, at the time of starting a plasma process or during a plasma process, when the plasma load is changed, the above-described proportional relation ($V_{dc} \approx KV_{pp}$) between the self-bias ($-V_{dc}$) and the amplitude of the high frequency voltage $V_{pp}$ on the susceptor 12 is not established, and the absolute value ($V_{dc}$) of the self-bias ($-V_{dc}$) becomes lower than $KV_{pp}$. In this case, RF power is not sufficiently absorbed to the plasma load, and a RF reflected wave power $P_r$ is increased accordingly.

In order to respond to such a change in the plasma load, the DC voltage control unit 144 controls the output voltage (second DC voltage) $-B_{DC}$ of the second DC power supply 104 to satisfy, for example, $-B_{DC} = -(K*MV_{pp} - J*MP_r)$ or $-B_{DC} = -(K - D*M_{Pr})*MV_{pp}$, according to the RF voltage amplitude measurement value $MV_{pp}$ measured from the $V_{PP}$ measurement unit 146 and the RF reflected wave power measurement value $MP_r$ measured from the RF power monitor 148. Herein, J and D are coefficients.

Further, in order to further increase stability and accuracy of variable control of the second DC voltage $-B_{DC}$ according to the change in the plasma load, the DC voltage control unit 144 controls the output voltage (second DC voltage) $-B_{DC}$ of the second DC power supply 104 to satisfy, for example, $-B_{DC}=-K*MV_{pp}*E*(MP_f-MP_r)/MP_f$, according to the RF voltage amplitude measurement value $MV_{pp}$ measured from the $V_{PP}$ measurement unit 146 and the RF traveling wave power measurement value $MP_f$ and the RF reflected wave power measurement value $MP_r$ measured from the RF power monitor 148. Herein, E is a coefficient.

(Sequence in Example Embodiment)

Figure 3A:
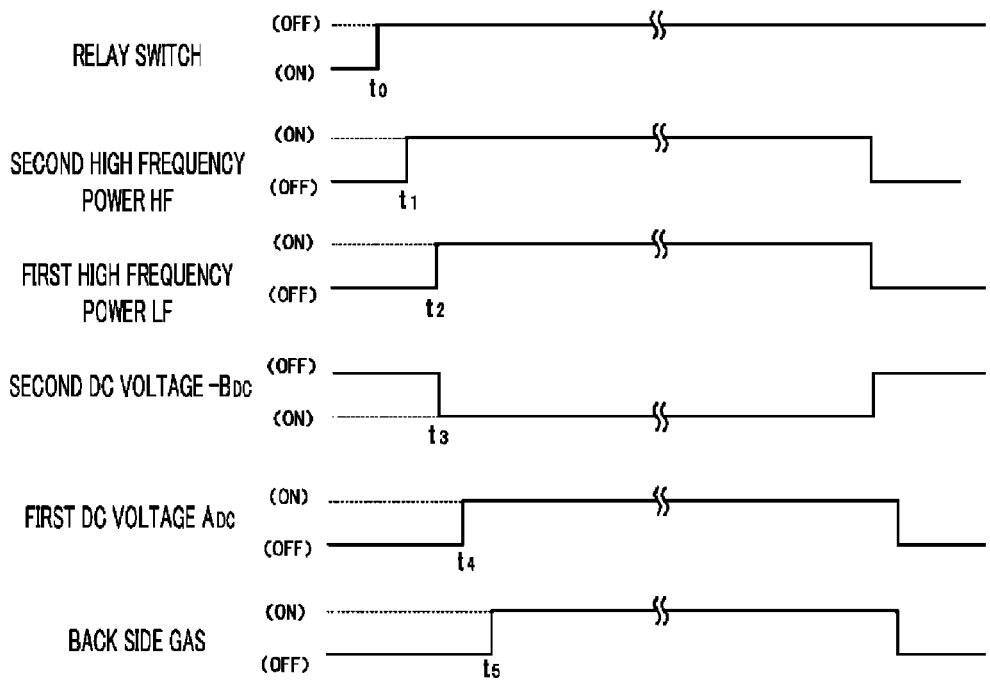
FIG. 3A illustrates a basic sequence when a single-substrate process in a single process (or a first process of multiple processes for a single-substrate process) is performed in the plasma processing apparatus.

FIG. 3A illustrates a timing chart, and particularly, a basic sequence at the time of starting an operation, among main parts when a single-substrate process in a single process is performed or when a first process of multiple processes for a single-substrate process is performed in the plasma processing apparatus in accordance with the example embodiment.

As described above, when the semiconductor wafer W as a target object is mounted on the electrostatic chuck 38 within the chamber 10, the relay switch 132 is maintained in turn-on and the susceptor 12 is electrically grounded. Further, after the inside of the chamber 10 is evacuated to be a depressurized state and introduction of the etching gas is started, at a preset time point $t_0$, the relay switch 132 is turned off. Thus, the susceptor 12 is electrically floated.

Then, at a time point $t_1$, the second high frequency power supply 30 is turned on, and the second matching device 102 starts a matching operation. Thus, application of the second high frequency power HF for plasma generation to the susceptor 12 from the second high frequency power supply unit 110 is started and electric discharge of the etching gas is started (plasma is ignited).

Thereafter (typically, within 2 seconds from the time point $t_1$), at a time point $t_2$, the first high frequency power supply 28 is turned on, and the first matching device 100 starts a matching operation. Thus, application of the first high frequency power LF for ion attraction to the susceptor 12 from the first high frequency power supply unit 108 is started. Then, the self-bias ($-V_{dc}$) is generated in a space (i.e. sheath) between the semiconductor wafer W on the susceptor 12 and bulk plasma, so that ions from the plasma are attracted to the semiconductor wafer W.

Herein, the self-bias ($-V_{dc}$) is a voltage applied between the surface of the semiconductor wafer W and the ground (ground potential member) via the first high frequency power supply unit 108. Further, all the capacitors connected in series on the high frequency transmission line of the first high frequency power supply unit 108, i.e. the capacitor 114 of the first matching device 100 or the capacitor formed between the semiconductor wafer W and the susceptor 12 via a dielectric layer of the electrostatic chuck 38 constitutes a so-called blocking capacitor.

Further, the same self-bias ($-V_{dc}$) is also generated at the focus ring 36 provided around the semiconductor wafer W on the susceptor 12, so that ions from the plasma are attracted to the focus ring 36. That is, the focus ring 36 is electrically provided in parallel with the semiconductor wafer W on the susceptor 12, and has a function of extending an edge of the semiconductor wafer W outward in a radial direction thereof with respect to the plasma.

Meanwhile, after the plasma is ignited, at a time point $t_3$ close to (before and after) the time point $t_2$ with a difference of, desirably, equal to or less than 1 second, the second DC power supply 104 is turned on, and application of the negative second DC voltage $-B_{DC}$ to the susceptor 12 is started. Thus, at the substantially same time when a surface potential of the semiconductor wafer W is decreased to a potential of the self-bias ($-V_{dc}$), a potential of the susceptor 12 is also decreased to the second DC voltage $-B_{DC}$ corresponding to the self-bias ($-V_{dc}$).

Then (typically, 0.3 seconds or more after the time point $t_3$), at a time point $t_4$, the first DC power supply 44 is turned on, and application of the positive first DC voltage $A_{DC}$ to the inner electrode 42 of the electrostatic chuck 38 is started. Thus, positive/negative electric charges, i.e. static electricity, are generated on a rear surface of the semiconductor wafer W and a front surface of the electrostatic chuck 38, so that the semiconductor wafer W is held on and attracted to the electrostatic chuck 38 by an electrostatic force. Herein, since the second DC voltage $-B_{DC}$ has been already applied to the susceptor 12, a potential of the susceptor 12 is not affected (electrostatically induced) by the first DC voltage $A_{DC}$. Then, at a next time point $t_5$, the back side gas supply unit is turned on, and a back side gas is supplied to the rear surface of the semiconductor wafer W through the gas path within the susceptor 12.

As such, in the case of the single process or the first process, at the time point $t_0$ after the semiconductor wafer W is mounted on the electrostatic chuck 38, the relay switch 132 is switched into turn-off from turn-on, and the susceptor 12 is switched from the electrically grounded state to a floated state. Then, from the time point $t_1$, the second high frequency power supply unit 110 applies the second high frequency power HF for plasma generation to the susceptor 12, and a processing gas is excited into plasma by energy of the second high frequency power HF in the chamber 10. Thereafter, from the time point $t_2$, the first high frequency power supply unit 108 applies the first high frequency power LF for ion attraction to the susceptor 12, and the self-bias ($-V_{dc}$) is generated. Then, from the time point $t_3$ close to the time point $t_2$ (with a difference of, desirably, equal to or less than 1 second), the negative second DC voltage $-B_{DC}$ corresponding to the self-bias ($-V_{dc}$) is applied to the susceptor 12. Thereafter, from the time point $t_4$ after the time point $t_3$, the positive first DC voltage $A_{DC}$ is applied to the inner electrode 42 of the electrostatic chuck 38.

According to such a sequence, since the negative second DC voltage $-B_{DC}$ corresponding to the self-bias ($-V_{dc}$) is applied to the susceptor 12, in a normal state, abnormal electric discharge is not generated in the gas spaces 56, 60, and 62 between the semiconductor wafer W and the susceptor 12. Further, right after the plasma process is started, a potential of the susceptor 12 is decreased at the substantially same time when a potential of the semiconductor wafer W is decreased to the self-bias ($-V_{dc}$). Therefore, even when the positive first DC voltage $A_{DC}$ is applied to the inner electrode 42 of the electrostatic chuck 38, and even if the plasma load is changed at the time of starting the process, there is no possibility of generation of abnormal electric discharge in the gas spaces 56, 60, and 62.

Figure 3B:
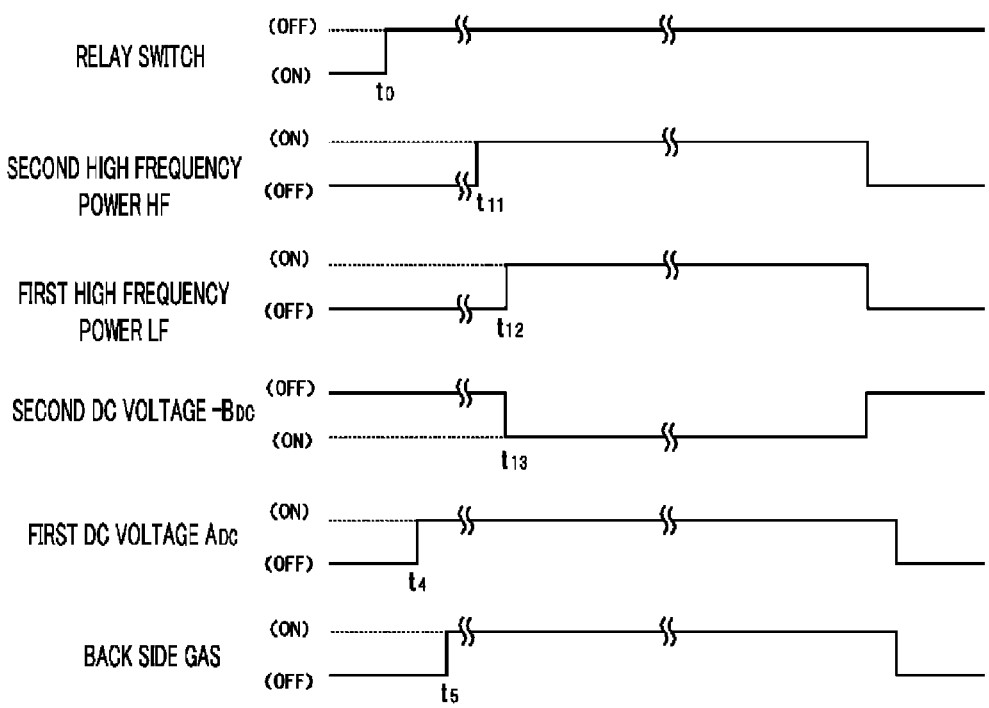
FIG. 3B illustrates a basic sequence when a second or further process of the multiple processes is performed in the plasma processing apparatus.

FIG. 3B illustrates a timing relation, and particularly, a basic sequence at the time of starting an operation, among main parts when a second or further process of multiple processes for the single-substrate process is performed.

In this case, even after the first process is ended, the relay switch 132 is maintained in turn-off, the first DC power supply 44 is maintained in turn-on (applies the first DC voltage $A_{DC}$), and the back side gas supply unit continues the supplying of the back side gas. In this state, in order to start the second process, at a time point $t_{11}$, the second high frequency power supply 30 is turned on, and the second matching device 102 starts the matching operation. Thus, application of the high frequency power HF for plasma generation to the susceptor 12 from the second high frequency power supply unit 110 is started, and electric discharge of the etching gas is started (plasma is ignited again).

Then, at a time point $t_{12}$, the first high frequency power supply 28 is turned on, and the first matching device 100 starts the matching operation. Thus, application of the first high frequency power LF for ion attraction to the susceptor 12 from the first high frequency power supply unit 108 is started. Then, the self-bias ($-V_{dc}$) is generated in the space (i.e. sheath) between the semiconductor wafer W on the susceptor 12 and bulk plasma, so that ions from the plasma are attracted to the semiconductor wafer W.

Meanwhile, after the plasma is ignited again, at a time point $t_{13}$ close to (before and after) the time point $t_{12}$ with a difference of, desirably, equal to or less than 1 second, the second DC power supply 104 is turned on, and application of the negative second DC voltage $-B_{DC}$ to the susceptor 12 is started. Thus, at the substantially same time when a surface potential of the semiconductor wafer W is decreased to a potential of the self-bias ($-V_{dc}$), a potential of the susceptor 12 is also decreased to the second DC voltage $-B_{DC}$ corresponding to the self-bias ($-V_{dc}$).

As such, in the case of the second or further process of multiple processes, while the first DC voltage $A_{DC}$ is applied to the susceptor 12, the second high frequency power HF for plasma generation is applied to the susceptor 12 from the second high frequency power supply unit 110 first (from the time point $t_{11}$) and, a processing gas is excited into plasma by energy of the second high frequency power HF in the chamber 10. Thereafter, from the time point $t_{12}$, the first high frequency power supply unit 108 applies the first high frequency power LF for ion attraction to the susceptor 12, and the self-bias ($-V_{dc}$) is generated again. Then, from the time point $t_{13}$ close to the time point $t_{12}$ (with a difference of, desirably, equal to or less than 1 second), the negative second DC voltage $-B_{DC}$ corresponding to the self-bias ($-V_{dc}$) is applied again to the susceptor 12.

According to such a sequence, right after the plasma process is started again, a potential of the susceptor 12 is decreased at the substantially same time when a potential of the semiconductor wafer W is decreased to the self-bias ($-V_{dc}$). Therefore, even if the plasma load is changed at the time of starting the process, there is no possibility of generation of abnormal electric discharge in the gas spaces 56, 60, and 62.

Figure 4A:
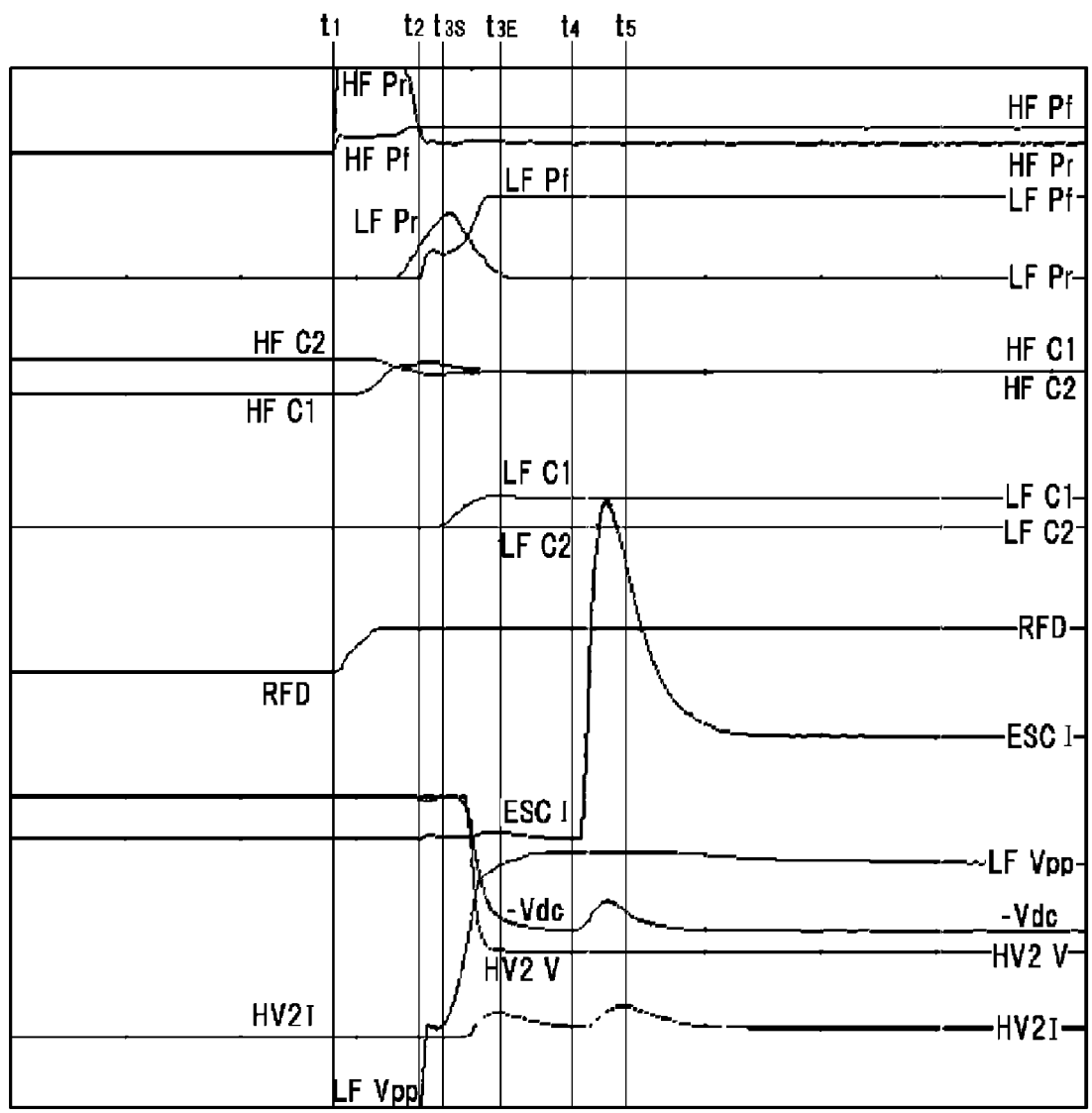
FIG. 4A illustrates a specific example of the basic sequence of FIG. 3A.
Figure 4B:
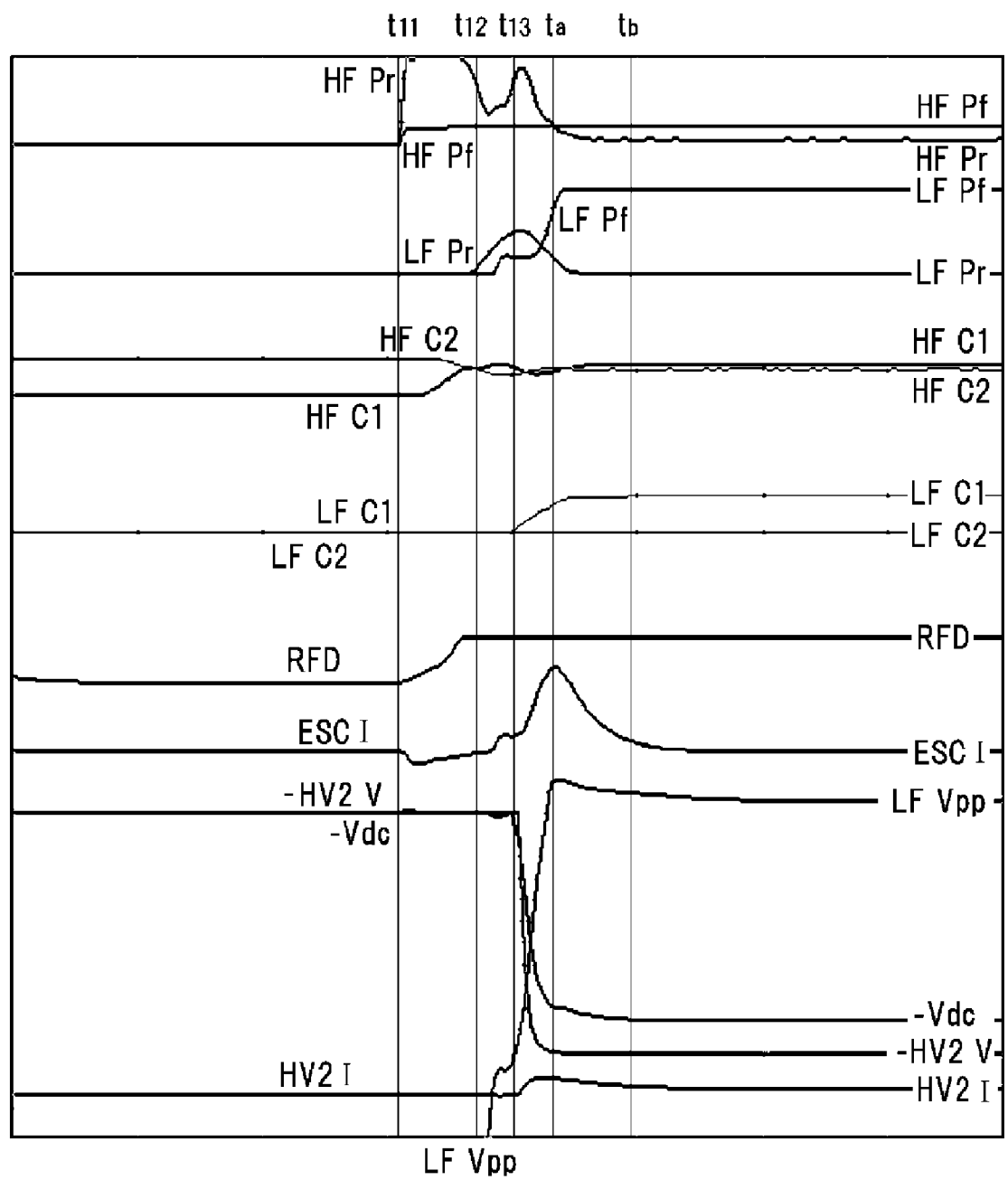
FIG. 4B illustrates a specific example of the basic sequence of FIG. 3B.

FIG. 4A and FIG. 4B illustrate specific examples of the sequence of this example embodiment. In the drawings, "HF Pf" and "HF Pr" denote the traveling wave power and the reflected wave power of the second high frequency power HF, respectively. "LF Pf" and "LF Pr" denote the traveling wave power and the reflected wave power of the first high frequency power LF, respectively. "HF C1" and "HF C2" denote variable capacitor steps (adjustment positions corresponding to capacitance values) of the variable capacitors 120 and 124 of the second matching device 102, respectively. "LF C1" and "LF C2" denote variable capacitor steps of the variable capacitors 112 and 114 of the first matching device 100, respectively. "RFD" denotes a plasma emission intensity measured by a plasma emission monitor (not illustrated). "ESC I" denotes an electric current flowing in a first DC voltage supply unit from the first DC power supply 44 to the inner electrode 42 of the electrostatic chuck 38. "LF $V_{pp}$" denotes the voltage amplitude (peak to peak value) of the first high frequency power LF measured by the $V_{PP}$ measurement unit 146 in the first matching device 100. "$-V_{dc}$" denotes the self-bias. "$-HV2$ V" denotes a potential of the susceptor 12. "HV2 I" denotes an electric current flowing in the second DC voltage supply unit from the second DC power supply 104 to the susceptor 12.

In the case of the single process or the first process of multiple processes (FIG. 4A), right after application of the first DC voltage $A_{DC}$ is started, the electric current "ESC I" rapidly flows in the first DC voltage supply unit, which is a transient phenomenon, and the electric current is immediately reduced. That is, it can be seen that abnormal electric discharge is not generated in the gas spaces 56, 60, and 62 between the semiconductor wafer W and the susceptor 12. Further, time points $t_{33}$ and $t_{3E}$ respectively denote a starting time and an ending time of application (operation) of the second DC voltage $-B_{DC}$, and a period from $t_{33}$ to $t_{3E}$ is about 0.35 seconds.

In the case of the second or further process of multiple processes (FIG. 4B), it can be seen that at the substantially same time when a surface potential of the semiconductor wafer W, i.e. the self-bias ($-V_{dc}$) is decreased, a potential of the susceptor 12 is also decreased to the second DC voltage $-B_{DC}$ corresponding to the self-bias ($-V_{dc}$). Further, even when a current "ESC I" is affected by reflection from plasma to be increased during a period from $t_{13}$ to $t_a$ in the first DC voltage supply unit, the electric current is rapidly decreased and returns back to the original state (about 0 A) at a time point $t_b$. As such, since an abnormality of the current "ESC I" in the first DC voltage supply unit is not found, abnormal electric discharge is not generated in the vicinity of the semiconductor wafer W, and particularly, in the gas spaces 56, 60, and 62 between the semiconductor wafer W and the susceptor 12.

In this example embodiment, as described above, the timing (time points $t_3$ and $t_{13}$) of starting output of the second DC voltage $-B_{DC}$ from the second DC power supply 104 is set to be the same as the timing of starting the matching operation of the first matching device 100, and such simultaneity is most desirable. However, practically, a slight difference of equal to or less than 1 second between the timings is allowable.

Further, regarding the first high frequency power LF for ion attraction and the second high frequency power HF for plasma generation, it is the standard practice to apply the second high frequency power HF first, and then, apply the first high frequency power LF to the susceptor 12. However, if necessary or under certain conditions, the first high frequency power LF may be first applied, and then, the second high frequency power HF may be applied, or the first high frequency power LF and the second high frequency power HF may be applied at the same time.

Even when the first high frequency power LF is first applied, plasma may be generated with lower electric discharge efficiency as compared with the second high frequency power HF, and in this case, the self-bias is also generated. Therefore, it is also desirable to set the timing of staring output of the second DC voltage $-B_{DC}$ to be the same as the timing of starting application of the first high frequency power LF, and for example, the output of the second DC voltage $-B_{DC}$ and the application of the first high frequency power LF may be started simultaneously or within a certain period of time from each other.

Figure 5:
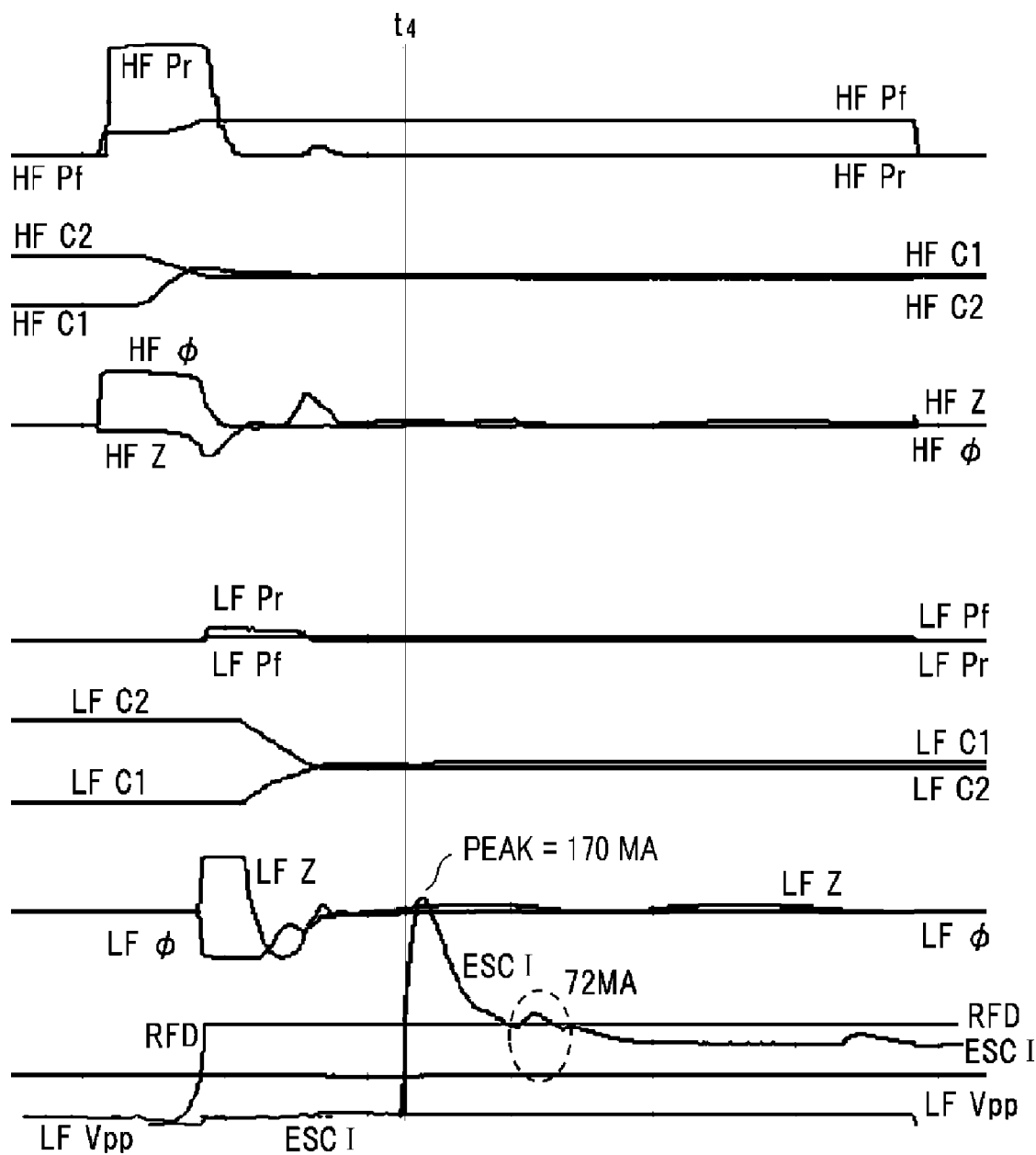
FIG. 5 illustrates a specific example of a sequence in a case (comparative example) where a second DC power supply in accordance with the example embodiment is not provided.

FIG. 5 illustrates a specific example of a sequence of a single process (or a first process) in the case (comparative example) where the second DC power supply 104 in accordance with the example embodiment is not provided. In FIG. 5, "HF φ" and "HF Z" denote control signals with respect to the variable capacitor steps of the variable capacitors 120 and 124 of the second matching device 102, respectively. "LF φ" and "LF Z" denote control signals with respect to the variable capacitor steps of the variable capacitors 112 and 114 of the first matching device 100, respectively. The others are the same as those of FIG. 4A.

As depicted, an electric current "ESC I" in the first DC voltage supply unit has a remarkably high electric current value (72 μA) even after other components are stabilized. This phenomenon occurs when abnormal electric discharge is generated in the gas spaces 56, 60, and 62 between the semiconductor wafer W and the susceptor 12.

(Modification Example of Matching Circuit)

In the above-described example embodiment, the first matching device 100 includes the L-shaped matching circuit using the variable capacitors 112 and 114 as variable reactance elements. If a frequency of the first high frequency power LF is relatively high, for example, about 3.2 MHz to about 13.56 MHz, the variable capacitors 112 and 114 can be favorably used in this matching circuit. However, if a frequency of the first high frequency power LF is relatively very low, for example, about 400 kHz, in order to obtain required impedance from the variable capacitors 112 and 114, electrostatic capacitances and an area (size) of an electrode thereof need to be increased 10 times or more, so that there is no practical value.

Figure 6:
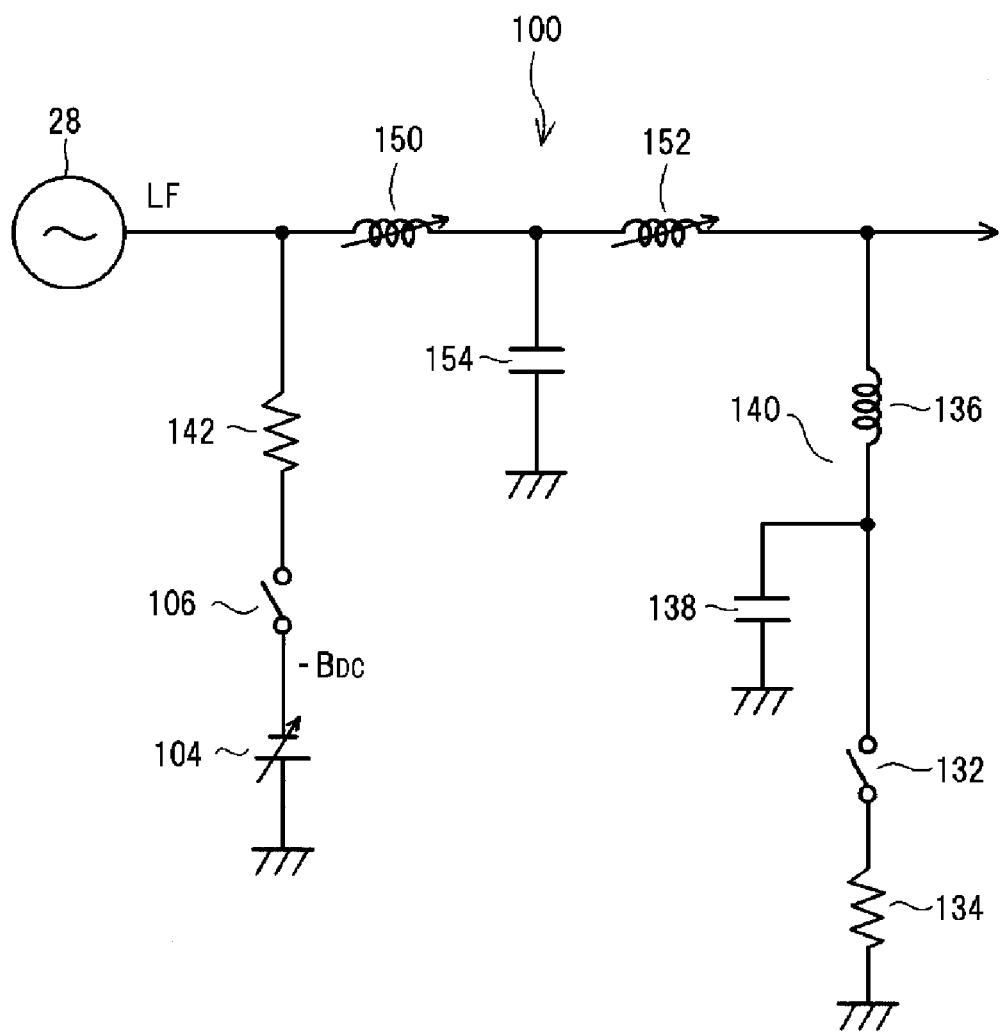
FIG. 6 is a circuit diagram illustrating a modification example of wire connection between a matching circuit of a first matching device and a second DC power supply in the plasma processing apparatus.

Therefore, if a frequency of the first high frequency power LF is as low as about 400 kHz, as depicted in FIG. 6, a T-shaped matching circuit including two variable inductors 150 and 152 and a fixed capacitor 154 can be appropriately used in the first matching device 100. Further, desirably, the output terminal of the second DC power supply 104 is wire-connected to an input terminal of the first matching device 100. Thus, the second DC power supply 104 can be apparently connected to a 50Ω system circuit. Furthermore, the second DC voltage $-B_{DC}$ from the second DC power supply 104 can be smoothly applied to the susceptor 12 via the variable inductors 150 and 152, and even if a high frequency voltage fluctuates at a side of an output terminal of the first matching device 100 due to a change in the load impedance, the second DC power supply 104 is not affected and maintains stable output.

(Second Experimental Example of Application of DC Voltage to Susceptor)

In the above-described example embodiment, the DC voltage control unit 144 constituting the main control unit 84 is configured to variably control the output voltage (second DC voltage) $-B_{DC}$ from the second DC power supply (variable DC power supply) 104 depending on the $V_{PP}$ measurement value $MV_{pp}$ or the reflected wave power measurement value $MP_r$ and the traveling wave power measurement value $MP_f$ obtained from the first high frequency power supply unit 108.

In another (second) experimental example, by using a power ($P_{LF}$) of the first high frequency power LF, a power ($P_{HF}$) of the second high frequency power HF, and the second DC voltage $-B_{DC}$ as parameters, whether or not abnormal electric discharge is generated in the vicinity of the semiconductor wafer W is investigated through a simulation of the plasma process with each selected combination [$P_{LF}$, $P_{HF}$, $-B_{DC}$] of the three parameters. Result data of the investigation are created into a database in the form of, for example, a table. Further, in an actual process, with respect to set values assigned to the power ($P_{LF}$) of the first high frequency power LF and the power ($P_{HF}$) of the second high frequency power HF, the value of the second DC voltage $-B_{DC}$ or an approximate value thereof when abnormal electric discharge is not generated in the simulation can be a set value or an instruction value for the second DC power supply 104.

Figure 7:
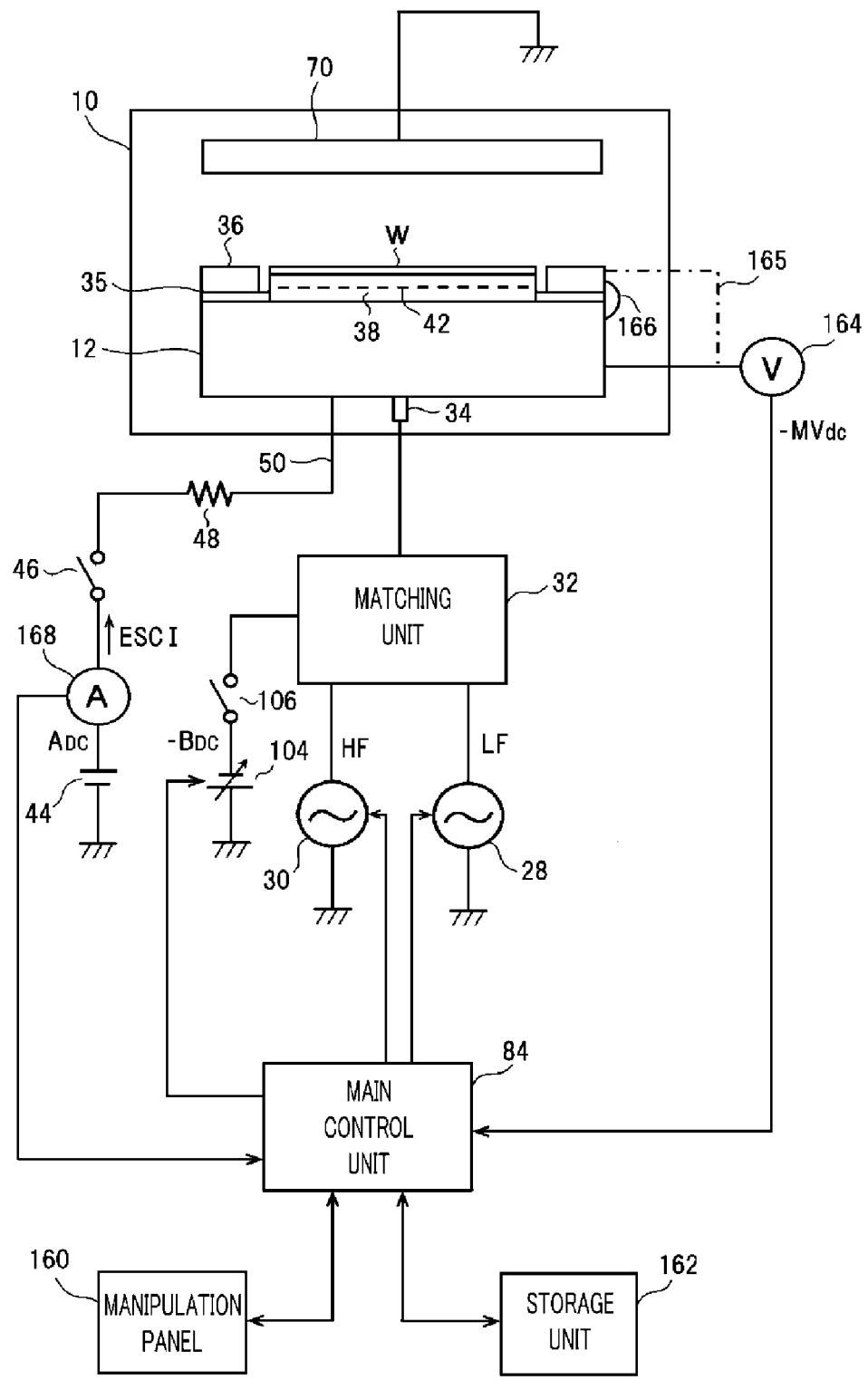
FIG. 7 is a schematic diagram explaining a second experimental example of a method of applying a second DC voltage to a susceptor in the plasma processing apparatus.

In this case, as depicted in FIG. 7, an operator carries out an experiment for creating a database through a manipulation panel 160 including a keyboard and a display, and a man-machine interface of the main control unit 84.

First, while not applying the second DC voltage $-B_{DC}$ to the susceptor 12 (the switch 106 is maintained in turn-off), a first simulation of the plasma process is carried out for each selected combination [$P_{LF}$, $P_{HF}$] of the two parameters by using the power ($P_{LF}$) of the first high frequency power LF and the power ($P_{HF}$) of the second high frequency power HF as parameters, and then, the self-bias ($-V_{dc}$) is measured with a voltage measurement device 164. In this case, the voltage measurement device 164 can directly measure a potential of the focus ring 36 as the self-bias ($-V_{dc}$) as indicated by a dashed dotted line 165. Further, after making a connection (short circuit) between the focus ring 36 and the susceptor 12 via a connecting conductor 166 of a jig detachably attached, the voltage measurement device 164 may measure a potential of the susceptor 12 as the self-bias ($-V_{dc}$).

By way of example, the power ($P_{LF}$) of the first high frequency power LF is selected from seven options of about 100 V, about 200 V, about 500 V, about 1000 V, about 2500 V, about 4800 V, and about 5800 V, and the power ($P_{HF}$) of the second high frequency power HF is selected from six options of about 100 V, about 300 V, about 500 V, about 1700 V, and about 2400 V. Then, a measurement value of the self-bias ($-V_{dc}$) obtained through the first simulation for each combination [$P_{LF}$, $P_{HF}$] is created into a database in the form of, for example, a table as depicted in FIG. 8.

In FIG. 8, "$-a_{i,j}$" in a cell in an i-th row and a j-th column represents a measurement value of the self-bias ($-V_{dc}$) obtained when an i-th value from the top (for example, a third value is about 500 V) is selected as the power ($P_{HF}$) of the second high frequency power HF and a j-th value from the left (for example, a fourth value is about 1000 V) is selected as the power ($P_{LF}$) of the first high frequency power LF.

Then, in addition to the power ($P_{LF}$) of the first high frequency power LF and the power ($P_{HF}$) of the second high frequency power HF, the second DC voltage $-B_{DC}$ ($-B_{DC}=-b_1, -b_2, -b_3, \ldots$) is added as the third parameter. A second simulation of the plasma process is carried out for each selected combination [$P_{LF}$, $P_{HF}$, $-B_{DC}$] of the three parameters to investigate whether or not abnormal electric discharge (or phenomenon corresponding thereto) is generated in the vicinity of the semiconductor wafer W. Result data of the investigation are created into a database in the form of, for example, a table as depicted in FIG. 9A, FIG. 9B, and FIG. 9C.

In FIG. 9A, FIG. 9B, and FIG. 9C, "$a_{i,j}-b_k$" in a cell in an i-th row and a j-th column represents a potential difference (estimated value) (δV) between bulk plasma and the susceptor 12 obtained when an i-th value from the top (for example, a third value is about 500 V) is selected as the power ($P_{HF}$) of the second high frequency power HF and a j-th value from the left (for example, a fourth value is about 1000 V) is selected as the power ($P_{LF}$) of the first high frequency power LF, and when $-b_k$ is selected as the second DC voltage $-B_{DC}$. Further, a sign "#" assigned to a cell in the table means that abnormal electric discharge (or a phenomenon corresponding thereto) is detected under the conditions of the cell. In general, a potential difference (δV) when the sign "#" is assigned (when abnormal electric discharge (or a phenomenon corresponding thereto) is generated) exceeds the listed value (threshold value) (V-th).

Further, in the second simulation, the self-bias ($-V_{dc}$) is not measured by the voltage measurement device 164. Instead, a waveform (instantaneous value) of the electric current "ESC I" is monitored by an ammeter 168 provided within the first DC voltage supply unit from the first DC power supply 44 to the inner electrode 42 of the electrostatic chuck 38. Further, absence or presence of abnormal electric discharge is indirectly determined based on whether or not abnormality as shown in the comparative example (FIG. 5) is found from the waveform of the electric current "ESC I".

The database or data tables (FIG. 8 and FIG. 9A to FIG. 9C) are accumulated or stored in a memory within the main control unit 84 or an external storage unit 162. Further, in an actual plasma process, the main control unit 84 selects a value of the second DC voltage $-B_{DC}$ which has no possibility of generation of abnormal electric discharge with reference to the database (table) depending on process conditions (recipe information) of the powers ($P_{LF}$ and $P_{HF}$) of the first high frequency power LF and the second high frequency power HF. Further, the main control unit 84 controls an output voltage (second DC voltage $-B_{DC}$) of the second DC power supply 104 to be the selected value.

(Third Experimental Example of Application of DC Voltage to Susceptor)

Figure 10:
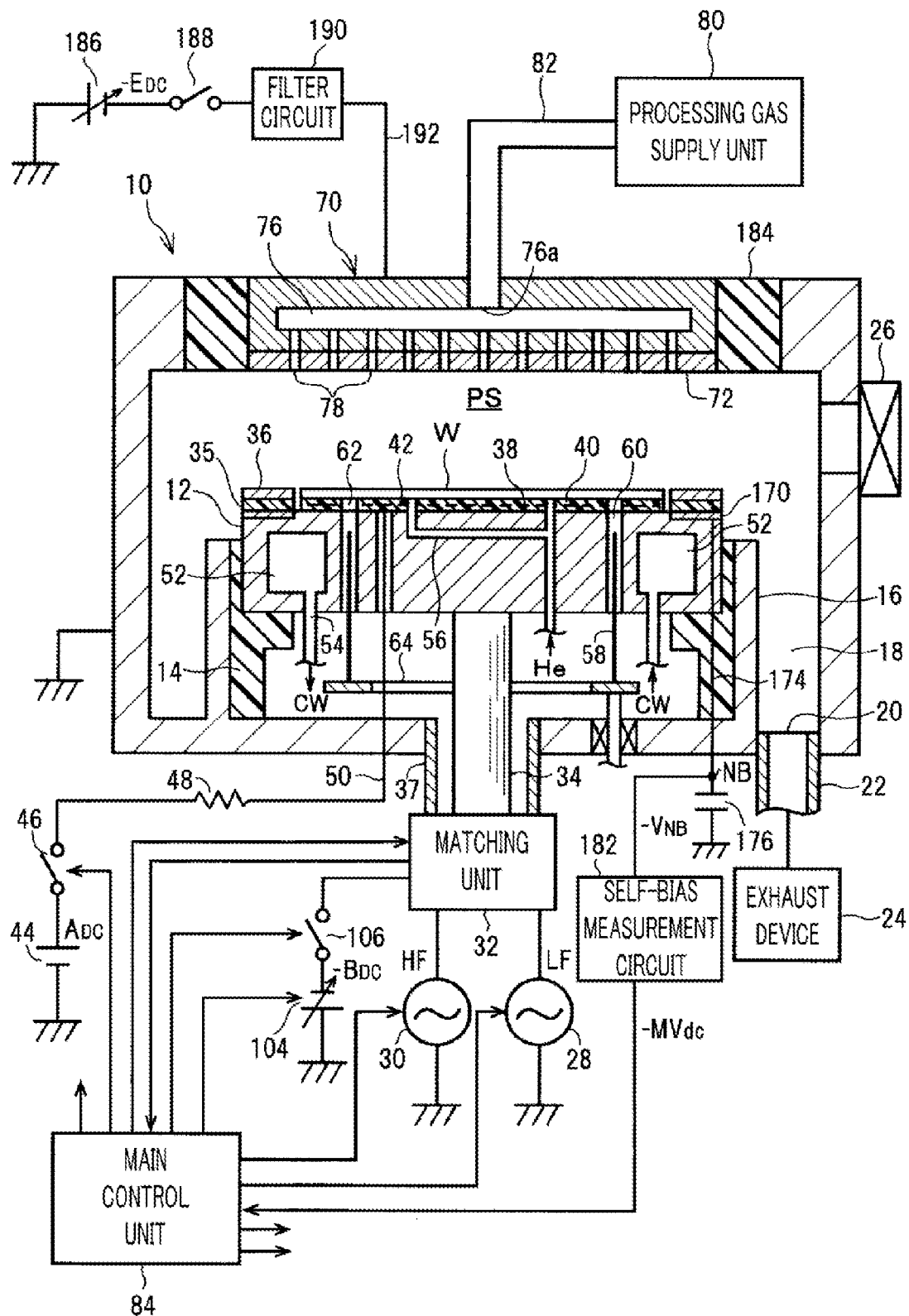
FIG. 10 is a cross sectional view illustrating a configuration of a plasma processing apparatus in a second example embodiment.
Figure 11:
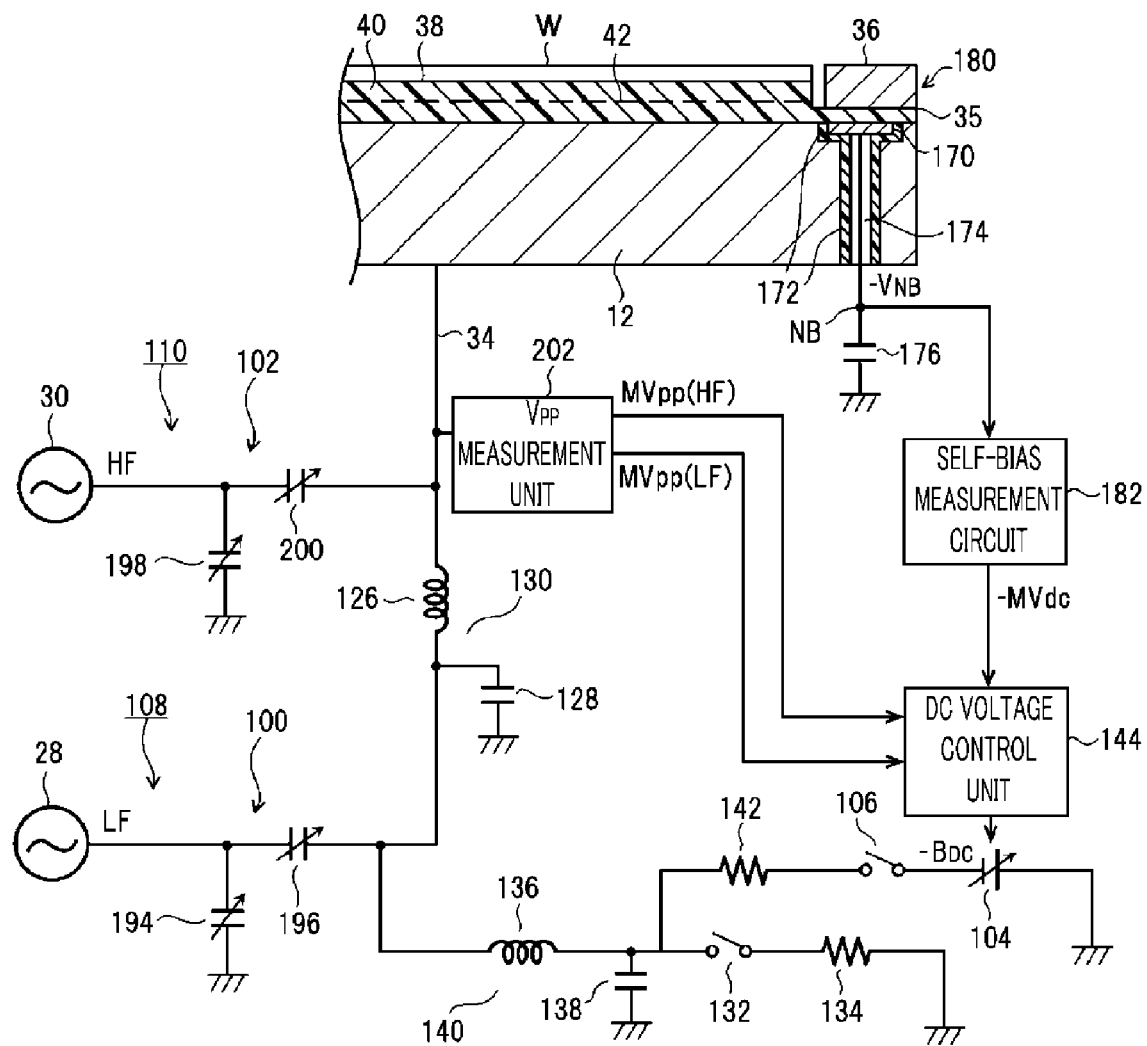
FIG. 11 illustrates mainly featured parts of the plasma processing apparatus of FIG. 10.

FIG. 10 and FIG. 11 illustrate still another (third) experimental example of a method of applying the second DC voltage $-B_{DC}$ to the susceptor 12 in the plasma processing apparatus in accordance with the example embodiment.

In this experimental example, the self-bias ($-V_{dc}$) generated on the surface of the semiconductor wafer W on the susceptor 12 is in-situ monitored, and the output voltage (second DC voltage) $-B_{DC}$ from the second DC power supply 104 is controlled to follow the self-bias ($-V_{dc}$) in the feedback manner in real time.

To be specific, in order to in-situ monitor the self-bias ($-V_{dc}$) generated between bulk plasma and the semiconductor wafer W (and the focus ring 36) on the susceptor 12 when plasma is generated in the chamber 10, a ring-shaped electrode plate 170 is provided on an upper surface of the susceptor 12 to face the focus ring 36 via the dielectric layer 35. The electrode plate 170 is electrically insulated from the susceptor 12 by an insulator 172 made of, for example, ceramic, and is connected to a ground potential member (not illustrated) via, for example, a rod-shaped conductor 174 passing through the susceptor 12 and a capacitor 176 provided outside. Further, the rod-shaped conductor 174 is also electrically insulated from the susceptor 12 by the insulator 172.

When the self-bias ($-V_{dc}$) is generated on the surfaces of the semiconductor wafer W and the focus ring 36, i.e. plasma is generated within the chamber 10, the surfaces of the semiconductor wafer W and the focus ring 36 have a negative potential which is equal to the self-bias ($-V_{dc}$). Since the focus ring 36 is typically made of a single material such as Si, the whole focus ring 36 constitutes an electrode plate. That is, a capacitor 180 in which the dielectric layer 35 is provided between the focus ring 36 and the electrode plate 170 is formed. Thus, a potential on the surface of the focus ring 36 which is equal to the self-bias ($-V_{dc}$) is divided by the two capacitors 180 and 176 connected in series, and a divided voltage ($-V_{NB}$) proportional to the self-bias ($-V_{dc}$) is obtained at a connection point (node) NB between the capacitors 180 and 176. That is, when electrostatic capacitances of the capacitors 180 and 176 are $C_{180}$ and $C_{176}$, respectively, the divided voltage ($-V_{NB}$) measured at the node NB is expressed by Equation (1) below.

$$-V_{NB} = -V_{dc} * C_{180}/(C_{180} + C_{176}) \qquad (1)$$

A self-bias measurement circuit 182 reads the divided voltage ($-V_{NB}$) measured at the node NB and obtains a measurement value ($-MV_{dc}$) of the self-bias ($-V_{dc}$) by performing an inverse operation of Equation (1). The DC voltage control unit 144 controls the output voltage (second DC voltage $-B_{DC}$) to satisfy, for example, $-B_{DC} = -H*MV_{dc}$, from the second DC power supply 104 based on the self-bias measurement value ($-MV_{dc}$) of the self-bias measurement circuit 182. Herein, H is a coefficient, and for example, H=1.

If the data tables (FIG. 8, and FIG. 9A to FIG. 9C) according to the second experimental example are provided, the DC voltage control unit 144 (main control unit 84) may control or select a value of the second DC voltage $-B_{DC}$ such that a potential difference ($\delta V$) between the second DC voltage $-B_{DC}$ and the self-bias ($-V_{dc}$) does not exceed the threshold value (V-th).

As such, in this experimental example, the self-bias ($-V_{dc}$) generated on the surface of the semiconductor wafer W on the susceptor 12 is in-situ monitored, and the output voltage (second DC voltage) $-B_{DC}$ from the second DC power supply 104 is controlled to be equal to or to follow a present value of the self-bias ($-V_{dc}$) in real time. Therefore, even if the self-bias ($-V_{dc}$) is changed in any way or even if the first DC voltage $A_{DC}$ is applied to the inner electrode of the electrostatic chuck 38 in any way (at a certain timing with a certain voltage value), a potential difference between the semiconductor wafer W and the susceptor 12 is constantly maintained at a small value. Accordingly, it is possible to securely suppress abnormal electric discharge in the vicinity of the semiconductor wafer W.

(Fourth Experimental Example of Application of DC Voltage to Susceptor)

FIG. 10 and FIG. 11 illustrate still another (fourth) experimental example of a method of applying the second DC voltage $-B_{DC}$ to the susceptor 12 in the plasma processing apparatus in accordance with the example embodiment.

As depicted in FIG. 10, in this plasma processing apparatus, the shower head 70 serving as the upper electrode (facing electrode) is provided at the ceiling of the chamber 10 via a ring-shaped insulator 184 to face the susceptor 12 in parallel with each other. Further, there is provided a DC power supply 186 configured to apply a negative DC voltage ($-E_{DC}$), which is desirably variable DC voltage, to the upper electrode 70. An output terminal of the DC power supply 186 is electrically connected to the upper electrode 70 via a switch 188, a filter circuit 190, and a DC power supply line 192. The filter circuit 190 is configured to apply the DC voltage ($-E_x$) from the DC power supply 186 directly to the upper electrode 70. Meanwhile, the filter circuit 190 is also configured to flow a high frequency power, which is introduced from the susceptor 12 to the DC power supply line 192 through the processing space PS and the upper electrode 70, toward a ground line without flowing the high frequency power toward the DC power supply 186. Further, at an adequate place facing the processing space PS within the chamber 10, a DC ground part (not illustrated) made of a conductive material such as Si, SiC, or the like is provided. The DC ground part is continuously grounded via a ground line (not illustrated).

In this plasma processing apparatus, for example, about 3.2 MHz is selected as a frequency of the first high frequency power LF for ion attraction, and for example, about 40.68 MHz is selected as a frequency of the second high frequency power HF for plasma generation. In this case, as depicted in FIG. 11, the first matching device 100 includes an L-shaped matching circuit including two variable capacitors 194 and 196, and the second matching device 102 also includes an L-shaped matching circuit including two variable capacitors 198 and 200.

If a frequency of the second high frequency power HF is about 40.68 MHz or less, a voltage amplitude $V_{pp}$ of the second high frequency power HF in a voltage amplitude of a high frequency voltage on the susceptor is not negligible. Therefore, in this experimental example, as a modification example of the first experimental example (FIG. 2) where the voltage amplitude $V_{pp}$ of the high frequency voltage on the susceptor 12 is monitored, a voltage amplitude $V_{pp}$ (LF) of the first high frequency power LF obtained in the first high frequency power supply unit 108 and a voltage amplitude $V_{pp}$ (HF) of the second high frequency power HF obtained in the second high frequency power supply unit 110 are monitored. Then, the DC voltage control unit 144 controls the second DC power supply 104 based on the respective voltage amplitudes $V_{pp}$ (LF) and $V_{pp}$ (HF) of the high frequency powers LF and HF.

In terms of hardware, as depicted in FIG. 11, on a high frequency transmission line between the low pass filter 130 and the power supply rod 34, a $V_{pp}$ measurement unit 202, which is a dual frequency responding type, is provided. This $V_{pp}$ measurement unit 202 is configured to differentiate and measure the voltage amplitudes $V_{pp}$ (LF) and $V_{pp}$ (HF) of the first high frequency power LF and the second high frequency power HF by using, for example, a superheterodyne filter circuit, and supply the measurement values $MV_{pp}$ (LF) and $MV_{pp}$ (HF) to the DC voltage control unit 144.

Further, in the same manner as the first experimental example, a RF power monitor (not illustrated) may be provided in each of the first and second high frequency power supply units 108 and 110, and a traveling wave power measurement value $MP_f$ (LF) and a reflected wave power measurement value $MP_r$ (LF) of the first high frequency power LF and a traveling wave power measurement value $MP_f$ (HF) and a reflected wave power measurement value $MP_r$ (HF) of the second high frequency power HF may be outputted to the DC voltage control unit 144. In this case, the DC voltage control unit 144 can control the output voltage (second DC voltage) $-B_{DC}$ from the second DC power supply 104 depending on the RF voltage amplitude measurement values $MV_{pp}$ (LF) and $MV_{pp}$ (HF) from the $V_{pp}$ measurement unit 202 and the reflected wave power measurement values $MP_r$ (LF) and $MP_r$ (HF) from the both RF power monitors. Alternatively, the DC voltage control unit 144 may control the output voltage (second DC voltage) $-B_{DC}$ from the second DC power supply 104 depending on the RF voltage amplitude measurement values $MV_{pp}$ (LF) and $MV_{pp}$ (HF) from the $V_{PP}$ measurement unit 202 and the traveling wave power measurement values $MP_f$ (LF) and $MP_f$ (HF) and the reflected wave power measurement values $MP_r$ (LF) and $MP_r$ (HF) from the both RF power monitors.

(Fifth Experimental Example of Application of DC Voltage to Susceptor)

Figure 12:
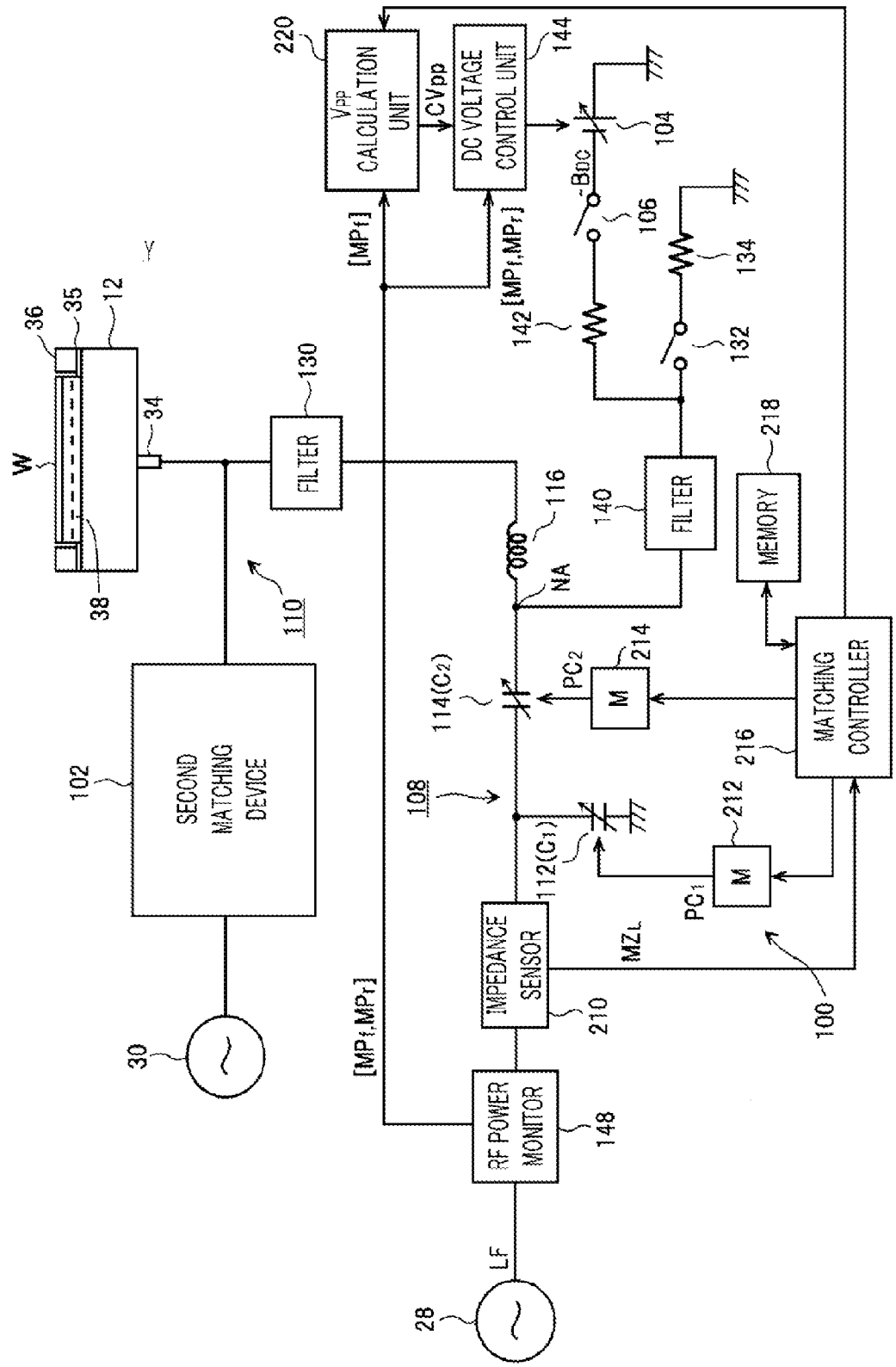
FIG. 12 is a circuit diagram illustrating a circuit configuration of main parts of a fifth (and a sixth) experimental example as a method of applying a second DC voltage to a susceptor.
Figures 13, 14:
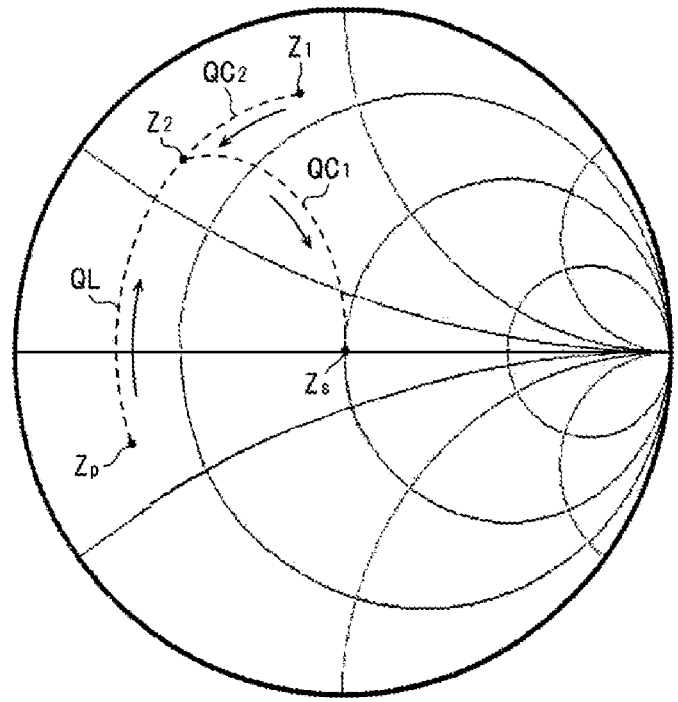
FIG. 13 illustrates an example of a matching table provided in a matching device.
FIG. 14 illustrates an operation of a matching device in an experimental example on Smith chart.

FIG. 12 to FIG. 14 illustrate still another (fifth) experimental example of a method of applying the second DC voltage $-B_{DC}$ to the susceptor 12 in the plasma processing apparatus in accordance with the example embodiment.

In this experimental example, there is provided a mapping table in which values of selectable positions of a variable reactance element are related with values of plasma impedance on a database. Then, a value of plasma impedance corresponding to a matching position at the present time is obtained from the mapping table, and an amplitude $V_{pp}$ of a high frequency voltage on the susceptor 12 is calculated based on the obtained value of plasma impedance and a value of RF power applied to the plasma. As a result, the second DC voltage $-B_{DC}$ is controlled depending on the calculated amplitude of $V_{pp}$.

As depicted in FIG. 12, in this experimental example, the first matching device 100 provided at the first high frequency power supply unit 108 for an ion-attraction system includes the L-shaped matching circuit including the variable capacitors 112 and 114, and the coil 116, an impedance sensor 210, and a matching controller 216 that variably controls positions (variable capacitor steps) $PC_1$ and $PC_2$ of the variable capacitors 112 and 114 through step motors (M) 212 and 214, respectively. Herein, the matching controller 216 and the step motors (M) 212 and 214 constitute an automatic matching device.

The impedance sensor 210 is configured to measure impedance of a load side which can be seen from the first high frequency power supply 28, i.e. load impedance $Z_L$ as a combined impedance of impedance of a load (mainly, plasma) within the chamber 10 and impedance of the matching circuit [112, 114, and 116]. The matching controller 216 includes a micro-computer (CPU) and variably controls the positions (variable capacitor steps) $PC_1$ and $PC_2$ of the variable capacitors 112 and 114 by rotating the step motors (M) 212 and 214 such that a measurement value $MZ_L$ of the load impedance $Z_L$ outputted from the impedance sensor 210 is equal to or close to a matching point $Z_S$ (typically, about 50Ω) corresponding to output impedance of the first high frequency power supply 28.

Herein, there is a linear corresponding relation between electrostatic capacitances $C_1$ and $C_2$ and the positions (variable capacitor steps) $PC_1$ and $PC_2$ of the variable capacitors 112 and 114, respectively. The matching controller 216 continuously monitors the present time positions $PC_1$ and $PC_2$ of the variable capacitors 112 and 114 by controlling the rotation of the step motors (M) 212 and 214.

Further, in the first matching device 100, as depicted in FIG. 13, a mapping table, in which combinations of all selectable positions [$PC_1(P_1C_1, P_2C_1, \ldots, P_mC_1)$, $PC_2(P_1C_2, P_2C_2, \ldots, P_nC_2)$] of the variable capacitors 112 and 114 are related with values of plasma impedance $Z_P(R_{ij}+jX_{ij})$ corresponding to respective combinations [$P_iC_1$ and $P_jC_2$] at the time of matching on a database, is stored in a memory 218 accessible by the CPU within the matching controller 216.

When the present time positions, i.e. matching positions, of the variable capacitors 112 and 114 in the matching state are $P_iC_1$ and $P_jC_2$, respectively, a value [$R_{ij}$] of a real part and a value [$X_{ij}$] of an imaginary part of the plasma impedance $Z_P(R_{ij}+jX_{ij})$ corresponding to respective combinations [$P_iC_1$, $P_jC_2$] are read from the mapping table.

Referring to Smith chart of FIG. 14, a matching operation of the matching device 100 will be explained. Herein, when the positions of the variable capacitors 112 and 114 are adjusted to $P_iC_1$ and $P_jC_2$, respectively, it is assumed that the matching state is maintained, i.e. the measurement value $MZ_L$ of the load impedance $Z_L$ obtained from the impedance sensor 210 is equal to or close to the matching point $Z_S$ (about 50Ω).

In this case, when a trajectory of the impedance from plasma within the chamber 10 to an output terminal of the impedance sensor 210 is analyzed on the Smith chart, the plasma impedance $Z_P(R_{ij}+jX_{ij})$ as a starting point reaches the matching point $Z_S$ (about 50Ω) through three circular arc-shaped trajectories QL, $QC_2$, and $QC_1$ in this sequence within the matching device 100.

Herein, the first trajectory QL ($Z_P \rightarrow Z_1$) is caused by an inductive reactance of the coil 116 connected in series with the plasma load at an end side of the matching device 100 and moves on the illustrated impedance chart in a right turn (clockwise direction). Since the coil 116 is a fixed inductor, a moving amount of this trajectory QL ($Z_P \rightarrow Z_1$) is constant.

The second trajectory $QC_2$ ($Z_1 \rightarrow Z_2$) is caused by a capacitive reactance of the variable capacitor 114 connected in series with the plasma load at a position right before the coil 116 and moves on the impedance chart in a left turn (counterclockwise direction). A moving amount of this trajectory $QC_2$($Z_1 \rightarrow Z_2$) varies depending on the electrostatic capacitance $C_2$ or the position $PC_2$ of the variable capacitor 114.

The third trajectory $QC_1$($Z_2 \rightarrow Z_S$) is caused by a capacitive reactance of the variable capacitor 112 connected in parallel with the plasma load at a position right before the variable capacitor 114 and moves on an admittance chart (not illustrated) in a right turn (clockwise direction). A moving amount of this trajectory $QC_1$($Z_2 \rightarrow Z_S$) varies depending on the electrostatic capacitance $C_1$ or position $PC_1$ of the variable capacitor 112.

Therefore, when an automatic matching operation is normally carried out in the matching device 100, the matching point $Z_S$ (about 50Ω) serves as the starting point on the Smith chart. At this time, by sequentially tracing the trajectories $QC_1$ and $QC_2$ having variable moving amounts depending on the matching positions $PC_1$ and $PC_2$ of the variable capacitors 112 and 114 and the trajectory QL having a fixed moving amount depending on a fixed inductance of the coil 116 in a reverse sequence to the above sequence, the plasma impedance $Z_P(R_{ij}+jX_{ij})$ at that time can be calculated.

Most of matching devices used in plasma processing apparatuses undergo an automatic matching test (simulation) by using a load simulator with variable impedance similar to the plasma load. During this test, by reading a value (R+jX) of impedance Z of the load simulator when combinations [$PC_1$, $PC_2$] of all the selectable positions $PC_1$ and $PC_2$ of the variable capacitors are in the matching state, the above-described mapping table (FIG. 13) is created. Therefore, such a mapping table serves as a characteristic database for each matching device.

In the typical automatic matching operation, the matching controller 216 checks a position of the load impedance $Z_L$ at the present time on the Smith chart with reference to the mapping table and determines an optimum control value, for the next time, for the positions $PC_1$ and $PC_2$ of the variable capacitors 112 and 114. Thus, errors in an automatic matching function can be reduced.

In this experimental example, as a part of functions of the main control unit 84, a $V_{pp}$ calculation unit 220 is provided at an outside (or an inside) of the matching device 100. This $V_{pp}$ calculation unit 220 accesses the memory 218 directly or through the matching controller 216 of the matching device 100 to obtain values (R and X) of plasma impedance $Z_P$ corresponding to the matching positions $PC_1$ and $PC_2$ of the variable capacitors 112 and 114 at the present time from the mapping table. Then, the $V_{pp}$ calculation unit 220 calculates Equation (2) below based on the obtained values (R and X) of the plasma impedance $Z_P$ and a measurement value (typically, a traveling wave power measurement value $MP_f$ as a net plasma input power) of the power (P) of the first high frequency power LF obtained from the RF power monitor 148 to obtain a voltage amplitude $V_{pp}$ (peak to peak value) of the first high frequency power LF.

$$V_{PP} = \{8P(R+X^2/R)\}^{1/2} \qquad (2)$$

The DC voltage control unit 144 controls the output voltage (second DC voltage) $-B_{DC}$ of the second DC power supply 104 according to a calculated value $CV_{PP}$ of the voltage amplitude $V_{pp}$ of the first high frequency power LF obtained from the $V_{pp}$ calculation unit 220. In this case, in the same manner as the above-described first experimental example, the DC voltage control unit 144 may control the output voltage (second DC voltage) $-B_{DC}$ to satisfy $-B_{DC} = -K*CV_{PP}$ (K is a coefficient: 0<K<1). Alternatively, the DC voltage control unit 144 may control the output voltage (second DC voltage) $-B_{DC}$ to satisfy $-B_{DC} = -(K*MV_{pp} - J*MP_r)$ or $-B_{DC} = -(K-D*MP_r)*MV_{pp}$ in consideration of the RF reflected wave power $P_r$ (J and D are coefficients). Further, the DC voltage control unit 144 may control the output voltage (second DC voltage) $-B_{DC}$ to satisfy $-B_{DC} = -K*MV_{pp}*E*(MP_f - MP_r)/MPf$ in additional consideration of the RF traveling wave power $P_f$ (E is a coefficient).

Equation (2) above is drawn as follows. When a RF power applied to plasma is P, impedance of the plasma is Z(R+jX), a RF voltage (effective value) on an output side of a matching device is V, and a RF electric current (effective value) is I, Equation (3) below is established on a high frequency transmission line of the high frequency power supply unit 108.

$$P = IV \cos \theta = I^2 Z \cos \theta = I^2 R \qquad (3)$$

Herein, $\cos \theta = R/(R^2+X^2)^{1/2}$ \qquad (4)

Equation (3) can be transformed into Equation (5) below.

$$V = I*R/\cos \theta = (P/R)^{1/2} \cdot R/\cos \theta \qquad (5)$$

Equation (6) below can be obtained from Equations (4) and (5).

$$V = \{P(R^2+X^2)/R\}^{1/2} = P(R+X^2/R)\}^{1/2} \qquad (6)$$

Since $V_{pp}$ (peak to peak value) is $2 \cdot 2^{1/2}$ times higher than V (effective value), Calculation Equation (1) can be obtained from Equation (6) as follows.

$$V_{PP} = 2 \cdot 2^{1/2} V = \{8P(R+X^2/R)\}^{1/2} \qquad (1)$$

In this experimental example, by using plasma impedance obtained from the characteristic mapping table provided in the first matching device 100, a value of the voltage amplitude $V_{pp}$ of the first high frequency power LF can be calculated, and based on the calculated value $CV_{PP}$ of the voltage amplitude $V_{pp}$, the negative second DC voltage $-B_{DC}$ corresponding to the self-bias ($-V_{dc}$) is applied to the susceptor 12 from the second DC power supply 104. Therefore, the $V_{PP}$ measurement unit 146 configured to directly measure the voltage amplitude $V_{pp}$ of the first high frequency power LF on the high frequency transmission line of the first high frequency power supply unit 108 is not needed.

Further, by using the characteristic mapping table provided in the first matching device 100 in order to reduce the errors in the automatic matching operation, the value of the voltage amplitude $V_{pp}$ of the first high frequency power LF is calculated based on the matching position of the matching device 100. Therefore, it is possible to monitor the voltage amplitude $V_{pp}$ with high accuracy and uniformity in measurement. Further, it is possible to control the second DC voltage $-B_{DC}$ applied to the susceptor 12 with less non-uniformity or the errors.

(Sixth Experimental Example of Application of DC Voltage to Susceptor)

As a modification example (sixth experimental example) of the above-described fifth experimental example, even if the matching device 100 does not include the mapping table, the $V_{pp}$ calculation unit 220 or the matching device 100 may calculate the value of the voltage amplitude $V_{pp}$ of the first high frequency power LF.

As described above, the matching controller 216 in the matching device 100 continuously monitors the present time positions $PC_1$ and $PC_2$ of the variable capacitors 112 and 114 by controlling the rotation of the step motors (M) 212 and 214, and can also calculate electrostatic capacitances $C_1$ and $C_2$ based on the positions $PC_1$ and $PC_2$ of the variable capacitors 112 and 114. Therefore, impedance ($Z_{100}$) of the matching circuit [112, 114, and 116] can be frequently calculated, for example, in the matching controller 216 based on the positions $PC_1$ and $PC_2$ of the variable capacitors 112 and 114 and the electrostatic capacitances $C_1$ and $C_2$.

Meanwhile, the load impedance $Z_L$ measured by the impedance sensor 210 is a combination of the plasma impedance $Z_P$ and the impedance ($Z_{100}$) of the matching circuit [112, 114, and 116]. That is, Equation (7) below can be established.

$$Z_L = Z_P + Z_{100}$$

$$\therefore Z_P = Z_L - Z_{100} \qquad (7)$$

Therefore, by operating Equation (7) based on the impedance ($Z_{100}$) of the matching circuit [112, 114, and 116] calculated in the matching controller 216 and the measurement value $MZ_L$ of the load impedance $Z_L$ outputted from the impedance sensor 210, the plasma impedance $Z_P$(R+jX) can be obtained.

The $V_{pp}$ calculation unit 220 operates Equation (2) based on the values (R and X) of the calculated plasma impedance $Z_P$ and the measurement value (typically, a traveling wave power measurement value $MP_f$ as a net plasma input power) of the power (P) of the first high frequency power LF obtained from the RF power monitor 148 to obtain the voltage amplitude $V_{pp}$ (peak to peak value) of the first high frequency power LF. In the same manner as the fifth experimental example, the DC voltage control unit 144 controls the output voltage (second DC voltage) $-B_{DC}$ of the second DC power supply 104 corresponding to the calculated value $CV_{PP}$ of the voltage amplitude $V_{pp}$ of the first high frequency power LF obtained from the $V_{pp}$ calculation unit 220.

(Seventh Experimental Example of Application of DC Voltage to Susceptor)

Figure 15:
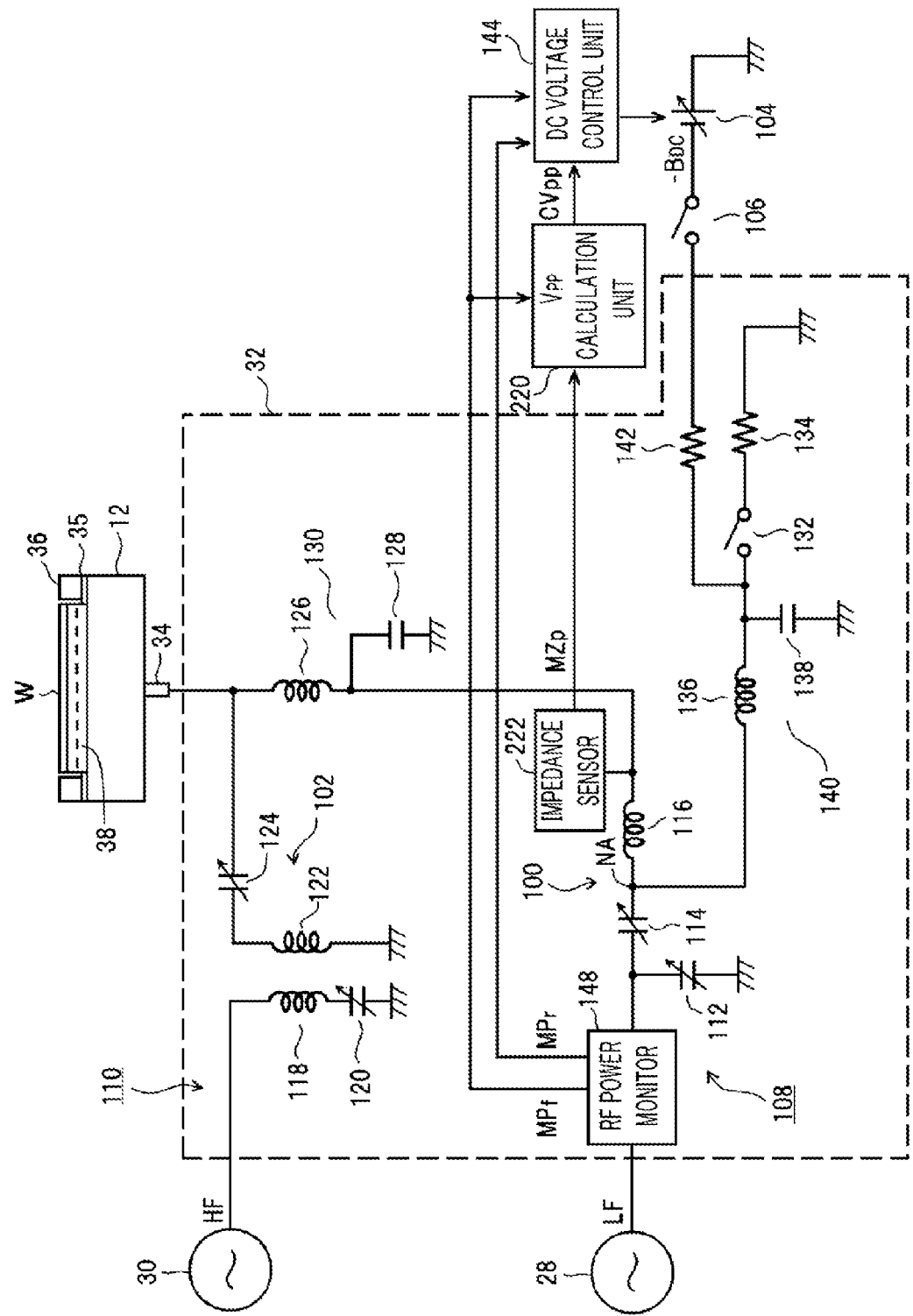
FIG. 15 is a circuit diagram illustrating a circuit configuration of main parts in a seventh experimental example as a method of applying a second DC voltage to a susceptor.

Referring to FIG. 15, still another (seventh) experimental example of a method of applying the second DC voltage $-B_{DC}$ to the susceptor 12 in the plasma processing apparatus will be explained in accordance with the example embodiment.

As depicted in FIG. 15, in this experimental example, an impedance sensor 222 is provided at an end side of the matching device 100 on the high frequency transmission line of the first high frequency power supply unit 108 and configured to measure impedance of the load side, i.e. plasma impedance $Z_P$(R, X). The $V_{pp}$ calculation unit 220 calculates Equation (2) based on a measurement value $MZ_P$(MR, MX) of the plasma impedance $Z_P$ obtained from the impedance sensor 222 and the measurement value of the power (P) of the first high frequency power LF obtained from the RF power monitor 148 to obtain the voltage amplitude $V_{pp}$ (peak to peak value) of the first high frequency power LF. In the same manner as the fifth or sixth experimental example, the DC voltage control unit 144 controls the output voltage (second DC voltage) $-B_{DC}$ of the second DC power supply 104 corresponding to the calculated value $CV_{PP}$ of the voltage amplitude $V_{pp}$ of the first high frequency power LF obtained from the $V_{pp}$ calculation unit 220.

According to this experimental example, even if the impedance sensor 210 or the matching controller 216 within the matching device 100 is not used, the second DC voltage $-B_{DC}$ corresponding to the self-bias ($-V_{dc}$) can be applied to the susceptor 12.

(Other Example Embodiment or Modification Example)

The capacitively coupled plasma processing apparatus in the above-described example embodiment is a lower electrode dual frequency application type apparatus that overlaps the high frequency power HF for plasma generation and the high frequency power LF for ion attraction and applies the overlapped frequencies to the lower electrode (susceptor) 12. However, the present example embodiment can be applied to a plasma processing apparatus that applies the high frequency power HF for plasma generation to the shower head (upper electrode) 70 and applies the high frequency power LF for ion attraction to the susceptor (lower electrode) 12, or applies a single kind of high frequency power to the susceptor (lower electrode) 12.

Further, the present example embodiment is not limited to the capacitively coupled plasma etching apparatus, but can be applied to a microwave plasma etching apparatus, or an inductively coupled plasma etching apparatus, and a helicon wave plasma etching apparatus, and can also be applied to apparatuses for other plasma processes such as plasma CVD, plasma oxidation, plasma nitration, sputtering, and the like.

The target substrate in the present example embodiment is not limited to the semiconductor wafer, but can be a flat panel display, an organic EL, various substrates for solar cell, or a photomask, a CD substrate, a print substrate, and the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A plasma processing apparatus comprising:
   a processing chamber in which a plasma process is performed;
   a susceptor made of a conductor and configured to mount thereon a target substrate within the processing chamber;
   a first high frequency power supply unit configured to apply a first high frequency power for ion attraction to the susceptor;
   an electrostatic chuck that is provided on a main surface of the susceptor to hold the substrate on the susceptor by an electrostatic force;
   a DC power supply configured to supply a negative and variable DC voltage;
   a RF voltage amplitude measurement unit configured to measure a voltage amplitude of the first high frequency power for ion attraction on a high frequency transmission line of the first high frequency power supply unit;
   a RF power measurement unit configured to measure a traveling wave power and a reflected wave power of the first high frequency power on the high frequency transmission line of the first high frequency power supply unit; and a DC voltage control unit configured to control the DC power supply to supply a negative DC voltage corresponding to a self-bias generated between plasma and the substrate based on a measurement value of the voltage amplitude of the first high frequency power measured from the RF voltage amplitude measurement unit and measurement values of the traveling wave power and the reflected wave power of the first high frequency power measured from the RF power measurement unit.

2. The plasma processing apparatus of claim 1,
wherein the DC voltage applying unit includes:
a DC power supply configured to supply a negative and variable DC voltage;
a self-bias measurement unit configured to measure the self-bias via a focus ring provided around a region of the main surface of the susceptor where the substrate is mounted; and
a DC voltage control unit configured to control the supplied voltage from the DC power supply depending on a measurement value of the self-bias obtained from the self-bias measurement unit.

3. The plasma processing apparatus of claim 2,
wherein the self-bias measurement unit includes:
an electrode plate that is electrically insulated from the susceptor and constitutes a first capacitor with the focus ring and a dielectric layer; and
a second capacitor for voltage division that is electrically insulated from the susceptor and connected between the electrode plate and a ground potential member,
wherein the measurement value of the self-bias voltage is obtained based on a divided DC voltage obtained from the second capacitor.

4. The plasma processing apparatus of claim 1,
wherein the first high frequency power supply unit includes:
a first high frequency power supply configured to supply the first high frequency power with a preset power; and
a first matching unit configured to match output impedance of the first high frequency power supply with load impedance,
wherein the first matching unit includes:
a matching circuit that includes a variable reactance element provided on a high frequency transmission line of the first high frequency power supply unit;
a load impedance measurement unit configured to measure the load impedance on the high frequency transmission line of the first high frequency power supply unit;
an automatic matching device configured to variably control a position of the variable reactance element such that a measurement value of the load impedance obtained from the load impedance measurement unit is equal to or close to a predetermined matching point corresponding to the output impedance of the first high frequency power supply; and
a mapping table in which values of selectable positions of the variable reactance element are related with values of plasma impedance on a database,
wherein the DC voltage applying unit includes:
a DC power supply configured to supply a negative and variable DC voltage;
a RF voltage amplitude calculation unit configured to calculate and obtain a voltage amplitude of the first high frequency power based on the value of the plasma impedance obtained from the mapping table with respect to a matching position of the variable reaction element at the present time and the power of the first high frequency power applied to the plasma from the first high frequency power supply unit; and
a DC voltage control unit configured to control the supplied voltage from the DC power supply depending on a calculated value of the voltage amplitude of the first high frequency power obtained from the RF voltage amplitude calculation unit.

5. The plasma processing apparatus of claim 1,
wherein the first high frequency power supply unit includes:
a first high frequency power supply configured to supply the first high frequency power with a preset power; and
a first matching unit configured to match output impedance of the first high frequency power supply with load impedance,
wherein the first matching unit includes:
a matching circuit that has variable impedance and is provided on a high frequency transmission line of the first high frequency power supply unit;
a load impedance measurement unit configured to measure the load impedance on the high frequency transmission line of the first high frequency power supply unit; and
an automatic matching device configured to variably control the impedance of the matching circuit such that a measurement value of the load impedance obtained from the load impedance measurement unit is equal to or close to a predetermined matching point corresponding to the output impedance of the first high frequency power supply,
wherein the DC voltage applying unit includes:
a DC power supply configured to supply a negative and variable DC voltage;
an impedance calculation unit configured to calculate and obtain a value of plasma impedance based on the measurement value of the load impedance obtained from the load impedance measurement unit and a value of the impedance of the matching circuit obtained from the automatic matching device;
a RF voltage amplitude calculation unit configured to calculate and obtain a voltage amplitude of the first high frequency power based on the calculated value of the plasma impedance obtained from the impedance calculation unit and the power of the first high frequency power applied to the plasma from the first high frequency power supply unit; and
a DC voltage control unit configured to control a supplied voltage from the DC power supply depending on the calculated value of the voltage amplitude of the first high frequency power obtained from the RF voltage amplitude calculation unit.

6. The plasma processing apparatus of claim 1,
wherein the DC voltage applying unit includes:
a DC power supply configured to supply a negative and variable DC voltage;
a plasma impedance measurement unit configured to measure plasma impedance on a high frequency transmission line of the first high frequency power supply unit;
a RF voltage amplitude calculation unit configured to calculate and obtain a voltage amplitude of the first high frequency power based on the measurement value of the plasma impedance obtained from the plasma impedance measurement unit and a power of the first high frequency power applied to the plasma from the first high frequency power supply unit; and a DC voltage control unit configured to control a supplied voltage from the DC power supply depending on the calculated value of the voltage amplitude of the first high frequency power obtained from the RF voltage amplitude calculation unit.

7. The plasma processing apparatus of claim 4, wherein the RF voltage amplitude calculation unit calculates a following equation below:

$$VPP=\{8P(R+X2/R)\}^{1/2}$$

wherein the VPP represents the voltage amplitude of the first high frequency power as a peak to peak value, P represents the power of the first high frequency power, and R and X respectively represent a real part and an imaginary part of the plasma impedance.

8. The plasma processing apparatus of claim 1, wherein the first high frequency power supply unit includes a first high frequency power supply configured to supply the first high frequency power with a preset power, and a first matching unit configured to match impedance of the first high frequency power supply with load impedance, and an output terminal of the DC voltage applying unit is connected to the susceptor via at least a part of a matching circuit of the first matching unit.

9. The plasma processing apparatus of claim 1, wherein an output terminal of the DC voltage applying unit is connected to the susceptor via a first filter circuit, which is configured to flow a direct electric current and block a high frequency power, and a part of the first high frequency power supply unit.

10. The plasma processing apparatus of claim 9, further comprising:

a switch configured to switch a state of the susceptor into any one of an electrically grounded state or a floated state, wherein one end of the switch is connected to a ground potential member and the other end thereof is connected to the susceptor via the first filter circuit and a part of the first high frequency power supply unit.

11. The plasma processing apparatus of claim 10, wherein the switch is controlled to switch the state of the susceptor from the grounded state to the floated state before applying the high frequency power to the susceptor from the first high frequency power supply unit and applying the DC voltage to the susceptor from the DC power supply.

12. A plasma processing method performed by the plasma processing apparatus of claim 1, the method comprising:

mounting the target substrate on the electrostatic chuck;

switching a state of the susceptor from an electrically grounded state into a floated state at a first time point after the target substrate is mounted on the electrostatic chuck;

generating plasma by exciting a processing gas within the processing chamber from a second time point after the first time point;

applying, to the susceptor, the first high frequency power having a frequency suitable for attracting ions of the plasma to the target substrate from a third time point after the second time point;

applying, to the susceptor, the negative DC voltage corresponding to the self-bias generated between the plasma and the target substrate from a fourth time point close to the third time point after the second time point; and applying a positive DC voltage to an inner electrode of the electrostatic chuck from a fifth time point after the fourth time point to hold the target substrate on the susceptor.

13. The plasma processing method of claim 12, further comprising:

supplying a gas for heat transfer toward a rear surface of the target substrate through a gas path formed in the susceptor and the electrostatic chuck from a sixth time point after the fifth time point.

14. The plasma processing method of claim 13, wherein the generating of the plasma includes applying, to the susceptor, a second high frequency power having a frequency suitable for electrically discharging the processing gas.

15. The plasma processing method of claim 12, wherein a time difference between the third time point and the fourth time point is equal to or less than 1 second.

* * * * *